(12) United States Patent
Tsukamoto

(10) Patent No.: US 8,474,116 B2
(45) Date of Patent: Jul. 2, 2013

(54) METHOD OF MANUFACTURING PIEZOELECTRIC ELEMENT AND METHOD OF MANUFACTURING LIQUID EJECTION HEAD

(75) Inventor: Ryuji Tsukamoto, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 1096 days.

(21) Appl. No.: 12/400,421

(22) Filed: Mar. 9, 2009

(65) Prior Publication Data

US 2009/0223030 A1 Sep. 10, 2009

(30) Foreign Application Priority Data

Mar. 10, 2008 (JP) ................................ 2008-059907

(51) Int. Cl.
*H01L 41/00* (2006.01)
*H04R 17/00* (2006.01)
*B21D 53/76* (2006.01)
*B23P 17/00* (2006.01)

(52) U.S. Cl.
USPC ........................................ 29/25.35; 29/890.1

(58) Field of Classification Search
USPC ............ 29/890.1, 25.35; 347/68–70; 310/311, 310/316.01, 317
See application file for complete search history.

(56) References Cited

U.S. PATENT DOCUMENTS

| | | | |
|---|---|---|---|
| 5,648,012 A * | 7/1997 | Higashibeppu et al. | 252/62.9 PZ |
| 5,719,607 A * | 2/1998 | Hasegawa et al. | 347/70 |
| 5,874,975 A * | 2/1999 | Hotomi et al. | 347/70 |
| 6,091,183 A * | 7/2000 | Nishimura et al. | 310/358 |
| 6,347,862 B1 * | 2/2002 | Kanno et al. | 347/68 |
| 6,547,376 B1 * | 4/2003 | Watanabe et al. | 347/70 |
| 6,623,110 B2 * | 9/2003 | Koike et al. | 347/68 |
| 6,900,579 B2 * | 5/2005 | Kanno et al. | 310/358 |
| 6,911,107 B2 * | 6/2005 | Kagawa et al. | 156/230 |
| 6,978,543 B2 * | 12/2005 | Sakamoto et al. | 29/890.1 |
| 6,993,840 B2 * | 2/2006 | Mouri et al. | 29/890.1 |
| 7,053,526 B2 * | 5/2006 | Unno et al. | 310/324 |

(Continued)

FOREIGN PATENT DOCUMENTS

| | | |
|---|---|---|
| JP | 9-286102 A | 11/1997 |
| JP | 10-286953 A | 10/1998 |
| JP | 2000-164829 A | 6/2000 |

OTHER PUBLICATIONS

Japanese Office Action dated Dec. 18, 2012 issued in Japanese Patent Application No. 2008-059907.

*Primary Examiner* — David Angwin
(74) *Attorney, Agent, or Firm* — Birch, Stewart, Kolasch & Birch, LLP

(57) ABSTRACT

A method of manufacturing a piezoelectric element, includes: a heating step of heating a piezoelectric film to a temperature not lower than a temperature at which a coercive electric field of the piezoelectric film becomes not higher than 0 V; an electric field application step of applying, to the piezoelectric film, an applied electric field in an opposite direction to a direction of orientation of the piezoelectric film while maintaining the temperature to which the piezoelectric film is heated in the heating step; and a temperature lowering step of lowering a temperature of the piezoelectric film to a temperature, in degrees Celsius, not higher than 1/3 of the Curie temperature while maintaining the applied electric field of a magnitude not lower than the coercive electric field applied to the piezoelectric film after the electric field application step, and then releasing the applied electric field applied to the piezoelectric film.

6 Claims, 15 Drawing Sheets

U.S. PATENT DOCUMENTS

| | | | |
|---|---|---|---|
| 7,069,631 B2 * | 7/2006 | Unno et al. | 29/25.35 |
| 7,279,825 B2 * | 10/2007 | Ifuku et al. | 310/358 |
| 7,350,904 B2 * | 4/2008 | Noguchi et al. | 347/72 |
| 7,419,252 B2 * | 9/2008 | Yasui | 347/68 |
| 7,466,067 B2 * | 12/2008 | Sugahara | 310/365 |
| 7,479,729 B2 * | 1/2009 | Sugahara et al. | 310/365 |
| 7,500,728 B2 * | 3/2009 | Mita et al. | 347/12 |
| 7,579,041 B2 * | 8/2009 | Kuriki et al. | 427/100 |
| 7,594,308 B2 * | 9/2009 | Sugahara | 29/25.35 |
| 7,636,993 B2 * | 12/2009 | Okabe et al. | 29/25.35 |
| 7,661,801 B2 * | 2/2010 | Mita et al. | 347/68 |
| 7,696,673 B1 * | 4/2010 | Yavid | 310/339 |
| 7,732,989 B2 * | 6/2010 | Sugahara et al. | 310/328 |
| 7,739,777 B2 * | 6/2010 | Sugahara | 29/25.35 |
| 7,753,497 B2 * | 7/2010 | Yagi | 347/71 |
| 7,766,464 B2 * | 8/2010 | Noguchi et al. | 347/72 |
| 7,887,163 B2 * | 2/2011 | Tsukamoto | 347/68 |
| 8,058,779 B2 * | 11/2011 | Suenaga et al. | 310/358 |
| 8,119,192 B2 * | 2/2012 | Tsukamoto | 427/100 |
| 8,177,336 B2 * | 5/2012 | Tsukamoto | 347/70 |
| 8,232,708 B2 * | 7/2012 | Shibata et al. | 310/358 |
| 8,252,365 B2 * | 8/2012 | Tsukamoto | 427/100 |
| 8,276,250 B2 * | 10/2012 | Wijngaards et al. | 29/25.35 |

* cited by examiner

METHOD OF MANUFACTURING PIEZOELECTRIC ELEMENT AND METHOD OF MANUFACTURING LIQUID EJECTION HEAD

BACKGROUND OF THE INVENTION

1. Field of the Invention

The present invention relates to a method of manufacturing a piezoelectric element and to a method of manufacturing a liquid ejection head, and more particularly, to technology for manufacturing an orientated piezoelectric element which is deposited by a technique such as sputtering.

2. Description of the Related Art

An inkjet recording apparatus which forms a desired image by ejecting ink droplets from an inkjet head onto a recording medium is widely used as a generic image forming apparatus. In an inkjet recording apparatus, piezoelectric elements (piezoelectric actuators) are suitable for use as pressure application devices which cause ink droplets to be ejected from the inkjet head.

Improved printing performance, and in particular, higher image resolution and faster printing speed, are demanded in inkjet heads. Consequently, it has been attempted to increase the image resolution and to raise the printing speed, by using a multiple-nozzle head structure in which the nozzles are formed to a very fine size and are arranged at high density. In order to achieve a high-density arrangement of nozzles, it is highly important to achieve a compact size of the piezoelectric elements which are pressure generating elements.

In order to form the piezoelectric elements to a compact size, it is effective to reduce the thickness of the piezoelectric elements, and for example, Japanese Patent Application Publication No. 10-286953 discloses technology for forming a lead dielectric layer (piezoelectric film) having a film thickness of 3 μm by sputtering, in order to achieve a thin film thickness in the piezoelectric elements.

By applying a relatively high voltage at room temperature to a piezoelectric element (piezoelectric actuator) which is generally used in an inkjet head, it is possible to obtain a similar amount of displacement irrespectively of the direction of the electric field applied, and the piezoelectric element (piezoelectric actuator) 358 for the inkjet head 350 illustrated in FIG. 20 uses an upper electrode 357B as an address electrode, and a lower electrode (substrate surface) 357A as a ground electrode, and is driven by applying a positive electric field to the address electrode side (an electric field in the electric field direction indicated by an arrow in FIG. 20). Reasons for adopting an electrode structure of this kind relate to the cost of the switching IC (driver circuit) and other components, and the ease of wiring, and the like.

However, the piezoelectric film manufactured by sputtering which is described in Japanese Patent Application Publication No. 10-286953 has a direction of orientation (polarization) which is determined when the film is deposited, and therefore produces a different amount of displacement depending on the direction of the electric field applied, even if the magnitude of the electric field is the same. In other words, the piezoelectric film manufactured by sputtering has the relationship between electric field intensity and amount of displacement illustrated in FIG. 21.

If the piezoelectric film 358A (piezoelectric element 358) in FIG. 20 is manufactured by sputtering, then the film is polarized in the direction from the lower electrode 357A toward the upper electrode 357B during the deposition of the film, and therefore in order to make the diaphragm 356 deform toward the lower side in FIG. 20 (in order to obtain displacement in the positive direction indicated by an arrow in FIG. 20), an electric field must be applied in the direction from the lower electrode 357A toward the upper electrode 357B (an electric field in the opposite direction to the electric field direction indicated by the arrow in FIG. 20).

When an electric field is applied in this direction, the upper electrode 357B is taken as an address electrode, the lower electrode 357A is taken as a ground electrode and a negative electric field must be applied to the upper electrode 357B, which means that the costs of the drive IC (driver circuit) and power supply are several times to several tens of times greater than when applying a positive electric field to the upper electrode 357B.

Furthermore, from the viewpoint of reducing costs, when the piezoelectric element 358 is driven by applying a positive electric field to the lower electrode 357A, if the diaphragm 356 is made of silicon, then there is a problem of electrical cross-talk in which a leak current 360 occurs between mutually adjacent lower electrodes as illustrated in FIG. 22, and the diaphragm is displaced even at piezoelectric elements which are not driven and to which an electric field is not applied, and in a worst case scenario, ink is ejected from pressure chambers (nozzles) where it is not supposed to be ejected. Moreover, due to the increase in the electrostatic capacitance, there is also a drawback in that the power consumption increases.

As a method for avoiding problems of this kind, there is a method for manufacturing an inkjet head by sequentially depositing, by sputtering, an upper electrode, a piezoelectric film and a lower electrode onto a monocrystalline substrate made of silicon (Si), magnesium oxide (MgO), or the like, (a so-called "dummy substrate"), thereby fabricating a piezoelectric element structure having a thin film which is to form a diaphragm on top of the lower electrode, whereupon the piezoelectric element structure is inverted mechanically and transferred (bonded) to a pressure chamber formed in a silicon substrate or a glass substrate (for example, the silicon base material having a pressure chamber 352 formed therein in FIG. 20).

However, in a method in which a previously manufactured piezoelectric element structure is reversed mechanically and transferred to a pressure chamber, it is necessary to align the piezoelectric element structure and the pressure chamber accurately in order to use a transfer bonding method, and accurate positional alignment between the piezoelectric element structure and the pressure chamber is extremely difficult to achieve. The accuracy of positional alignment of the piezoelectric element structure and the pressure chamber affects the ejection characteristics, and in an inkjet head comprising a plurality of nozzles, it is extremely difficult to fabricate a head having uniform ejection characteristics in each of the nozzles.

To summarize the problems relating to an oriented piezoelectric film as described above (for example, a piezoelectric film deposited by sputtering), a method which mechanically reverses a piezoelectric element and bonds same to a pressure chamber involves the problem of positional alignment accuracy during bonding, and a method which uses a lower electrode 110 as an address electrode involves the problem of electrical cross-talk occurring as a result of leakage current. Furthermore, a method which uses an electric field in the negative direction as the applied electric field involves the problem of increased costs in relation to the IC, and so on (see Table 1 below).

TABLE 1

| Issue | Method of resolution | Problem |
| --- | --- | --- |
| Opposite direction of orientation | Transfer previously manufactured piezoelectric element to pressure chamber | Positional alignment is difficult |
| | Lower address structure | Leakage current |
| | Negative driving | High costs |

SUMMARY OF THE INVENTION

The present invention has been contrived in view of these circumstances, an object thereof being to provide a method of manufacturing a piezoelectric element and a method of manufacturing a liquid ejection head, whereby a piezoelectric element suitable for use in an inkjet head is manufactured by an epitaxial growth method or an oriented growth method, such as sputtering.

In order to attain an object described above, one aspect of the present invention is directed to a method of manufacturing a piezoelectric element, comprising: a piezoelectric film deposition step of forming a piezoelectric film in epitaxial growth or orientated growth; an electrode forming step of forming an upper electrode and a lower electrode on the piezoelectric film; a heating step of heating the piezoelectric film to a temperature equal to or greater than a temperature at which a coercive electric field of the piezoelectric film becomes 0 V or lower; an electric field application step of applying, to the piezoelectric film, an electric field in an opposite direction to a direction of orientation of the piezoelectric film while maintaining the temperature to which the piezoelectric film is heated in the heating step; and a temperature lowering step of lowering a temperature of the piezoelectric film to a temperature of $1/3$ of the Curie temperature or lower while maintaining an electric field of a magnitude equal to or greater than the coercive electric field applied to the piezoelectric film after the electric field application step, and then releasing the electric field applied to the piezoelectric film.

According to this aspect of the invention, in a piezoelectric element which uses a piezoelectric film that is grown by epitaxial growth or orientated growth, after heating to a temperature at which the coercive electric field becomes 0 V or lower when reversing the polarization direction, an electric field of a magnitude equal to or greater than the coercive electric field is applied for a prescribed time period, and while maintaining the application of the electric field having a magnitude equal to or greater than the coercive electric field, the temperature of the piezoelectric film is lowered to a temperature equal to or lower than $1/3$ of the Curie temperature. Therefore, it is possible to reverse the direction of polarization of the piezoelectric film, as well as being able to obtain a desirable piezoelectric element in which the amount of displacement and the direction of displacement can be controlled.

From the viewpoint of preventing breakdown, the intensity of the electric field applied to the piezoelectric film during the voltage application step is less than 5 kV/mm.

The electric field release temperature at the time of release of the electric field should be decided with a view to eliminating difference in the polarization effects caused by difference in the material which forms the piezoelectric film. The electric field release temperature can be set to a temperature equal to or lower than $1/4$ of the Curie temperature.

Desirably, the temperature to which the piezoelectric film is heated in the heating step is equal or higher than 250° C.

According to this aspect of the invention, by setting the temperature of the piezoelectric film to 250° C. or higher, the coercive electric field of the piezoelectric film becomes equal to or lower than 0 V, and desirable polarization reversal processing can be carried out on the piezoelectric film.

More desirably, the temperature of the piezoelectric film is set to the Curie temperature.

Desirably, in the temperature lowering step, the magnitude of the electric field applied to the piezoelectric film is increased in accordance with the coercive electric field which increases as the temperature of the piezoelectric film falls.

According to this aspect of the invention, the magnitude of the electric field applied to the piezoelectric film during the lowering of the temperature is reliably equal to or greater than the coercive electric field, and desirable polarization reversal processing can be carried out on the piezoelectric film.

Desirably, in the temperature lowering step, the electric field applied to the piezoelectric film is released when the temperature of the piezoelectric film reaches equal to or lower than 100° C.

According to this aspect of the invention, by setting the temperature at release of the electric field to be 100° C. or lower, desirable polarization reversal processing is carried out on the piezoelectric film, and desired characteristics can be obtained in the piezoelectric film.

Desirably, in the temperature lowering step, the electric field applied to the piezoelectric film is released when the temperature of the piezoelectric film reaches equal to or lower than 70° C.

According to this aspect of the invention, by setting the temperature at release of the electric field to be 70° C. or lower, more desirable polarization reversal processing is carried out on the piezoelectric film, and desired characteristics can be obtained in the piezoelectric film.

Desirably, in the piezoelectric film deposition step the piezoelectric film is formed by any one technique of a sputtering method, a chemical vapor deposition method and a sol-gel method.

According to this aspect of the invention, by using sputtering, CVD or sol gelation, it is possible to deposit a piezoelectric film which is formed to a very small thickness.

In order to attain an object described above, another aspect of the present invention is directed to a method of manufacturing a liquid ejection head, comprising: a lower electrode forming step of forming a lower electrode on a base substrate; a piezoelectric film deposition step of forming a piezoelectric film in epitaxial growth or oriented growth on a surface on an opposite side of the lower electrode to the base substrate; an upper electrode forming step of forming an upper electrode on a surface on an opposite side of the piezoelectric film to the lower electrode; a heating step of heating the piezoelectric film to a temperature equal to or greater than a temperature at which a coercive electric field of the piezoelectric film becomes 0 V or lower; an electric field application step of applying, to the piezoelectric film, an electric field in an opposite direction to a direction of orientation of the piezoelectric film while maintaining the temperature to which the piezoelectric film is heated in the heating step; a temperature lowering step of lowering the temperature of the piezoelectric film to a temperature of $1/3$ of the Curie temperature or lower while maintaining an electric field of a magnitude equal to or greater than the coercive electric field applied to the piezoelectric film after the electric field application step, and then releasing the electric field applied to the piezoelectric film; a pressure chamber forming step of forming a pressure chamber and a flow channel structure in the base substrate; and a nozzle substrate bonding step of bonding a nozzle substrate in which a nozzle is formed onto the base substrate in which the pressure chamber and the flow channel structure are formed.

According to this aspect of the invention, it is possible to employ a piezoelectric element manufactured by using a thin film manufacturing process which has an orientation, such as sputtering, as the pressure generating element in a liquid ejection head.

According to the present invention, in a piezoelectric element which uses a piezoelectric film that is grown by epitaxial growth or orientated growth, after heating to a temperature at which the coercive electric field becomes 0 V or lower when reversing the polarization direction, an electric field of a magnitude equal to or greater than the coercive electric field is applied for a prescribed time period, and while maintaining the application of the electric field having a magnitude equal to or greater than the coercive electric field, the temperature of the piezoelectric film is lowered to a temperature equal to or lower than ⅓ of the Curie temperature. Therefore, it is possible to reverse the direction of polarization of the piezoelectric film, as well as being able to obtain a desirable piezoelectric element in which the amount of displacement and the direction of displacement can be controlled.

BRIEF DESCRIPTION OF THE DRAWINGS

The nature of this invention, as well as other objects and benefits thereof, will be explained in the following with reference to the accompanying drawings, in which like reference characters designate the same or similar parts throughout the figures and wherein.

DETAILED DESCRIPTION OF THE PREFERRED EMBODIMENTS

Description of Method of Manufacturing Liquid Ejection Head

A method of manufacturing a liquid ejection head (method of manufacturing a piezoelectric element) relating to an embodiment of the present invention is now described with reference FIG. 1 to FIG. 11.

(1) Step of Forming Lower Electrode

Figure 1:
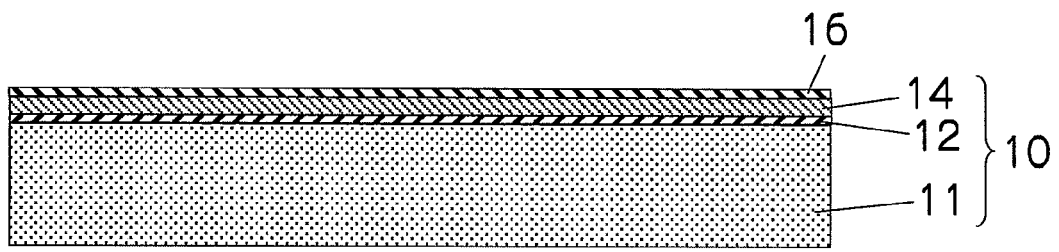
FIG. 1 is a diagram illustrating a substrate to which the method of manufacturing a liquid ejection head (piezoelectric element) relating to an embodiment of the present invention is applied.

FIG. 1 illustrates an SOI substrate 10, which is a surface-insulated substrate (namely, a silicon substrate provided with an insulating film of $SiO_2$, hereinafter called a "substrate"). The substrate 10 illustrated in FIG. 1 has a structure in which a silicon base material 11, an insulating layer 12 formed by a silicon oxide film, a silicon base material 14, and an insulating layer 16 formed by a silicon oxide film, are laminated together successively.

Figure 2:
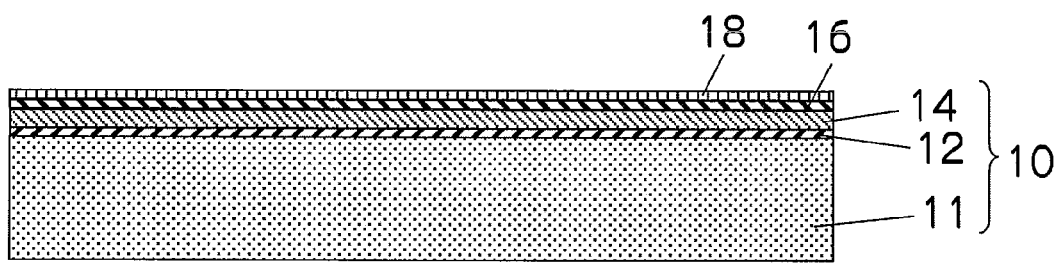
FIG. 2 is a diagram describing a step of forming a lower electrode.
Figure 3:
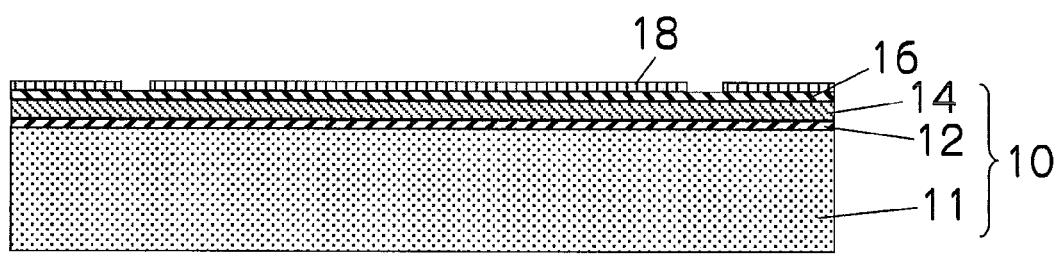
FIG. 3 is a diagram describing a step of patterning a lower electrode.

FIG. 2 illustrates a state where a metal film 18 forming a lower electrode has been deposited onto the substrate 10 illustrated in FIG. 1. The metal film 18 which is to form a lower electrode is deposited on the upper surface of the substrate 10 (the surface where the insulating layer 16 is formed), using a method such as sputtering, vapor deposition, or the like. Thereupon, as illustrated in FIG. 3, the metal film 18 is processed into a prescribed shape by using reactive ion etching (RIE). It is suitable to use iridium (Ir), platinum (Pt), titanium (Ti), or the like for the metal film (lower electrode) 18.

Figure 15A:
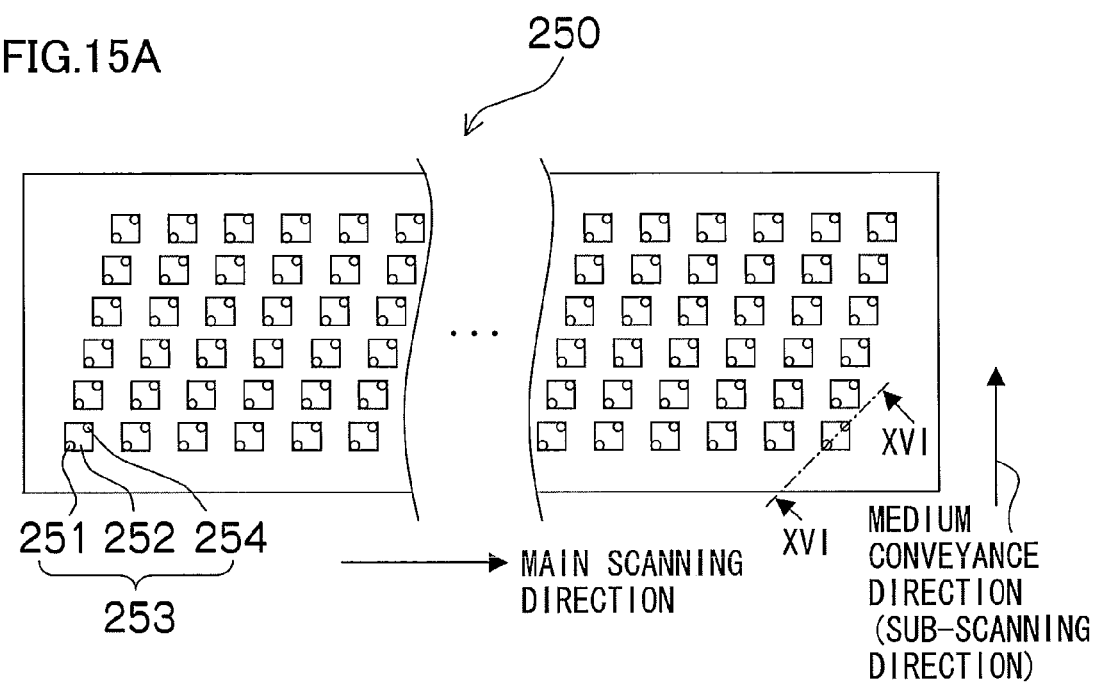
FIGS. 15A to 15C are plan view perspective diagrams illustrating examples of the head illustrated in FIG. 13.
Figure 15B:
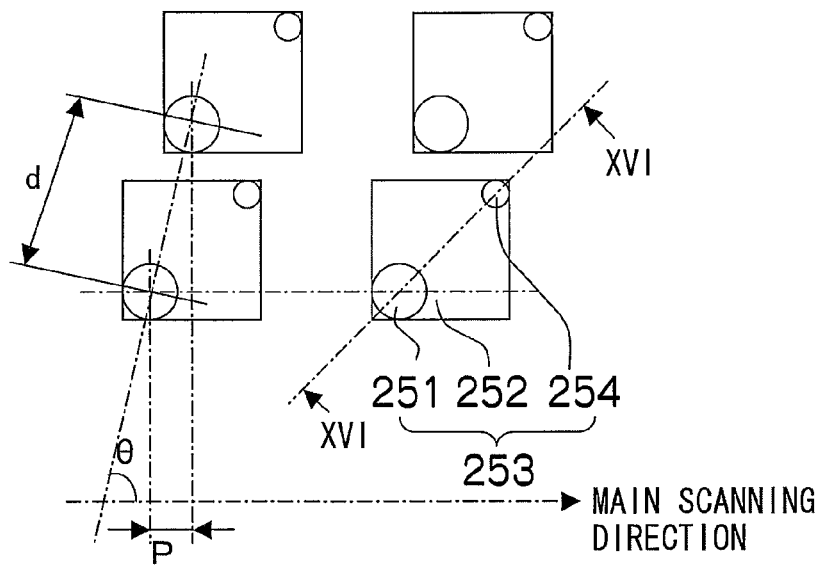
Figure 16:
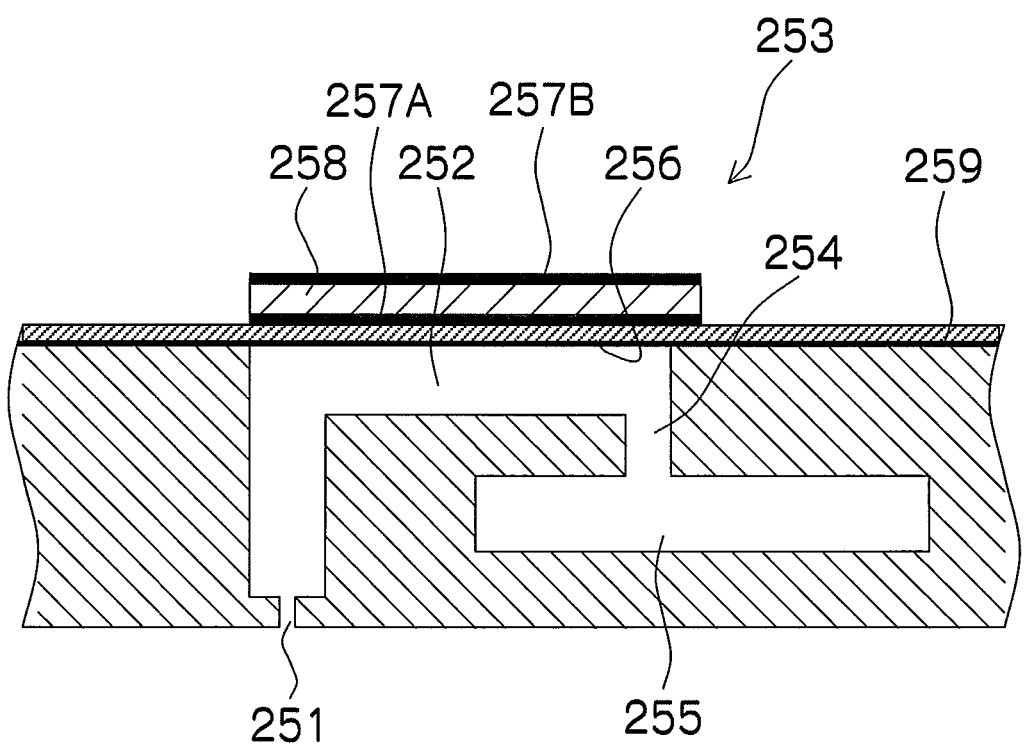
FIG. 16 is a cross-sectional diagram along line XVI-XVI in FIGS. 15A and 15B.

The arrangement pattern of the lower electrodes 18 forms the arrangement pattern of the piezoelectric actuators which include the piezoelectric elements, and the nozzles which eject ink (see FIGS. 15A and 15B) are arranged in accordance with the arrangement pattern of the piezoelectric actuators (the structure constituted by the piezoelectric elements 258 and the diaphragm 256 in FIG. 16). In other words, the arrangement pattern of the lower electrodes 18 is determined in accordance with the arrangement of the nozzles which eject ink.

(2) Step of Depositing Piezoelectric Film

Figure 4:
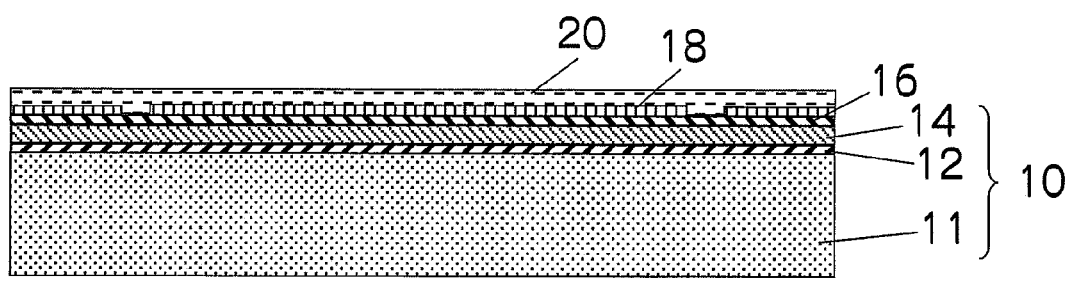
FIG. 4 is a diagram describing a step of depositing a piezoelectric film.

When the lower electrode (metal film) 18 has been processed into a prescribed shape (pattern), a piezoelectric film 20 having a prescribed orientation is deposited on the upper surface of the lower electrode 18 (the side of the lower electrode 18 opposite to the insulating layer 16) by using a thin film forming process based on epitaxial growth, such as sputtering, CVD, sol gelation, or the like. It is suitable to use PZT (lead zirconate titanate, Pb(Zr, Ti)O$_3$) for the piezoelectric film 20. FIG. 4 illustrates a state where the piezoelectric film 20 has been deposited.

(3) Step of Depositing Upper Electrode

Figure 5:
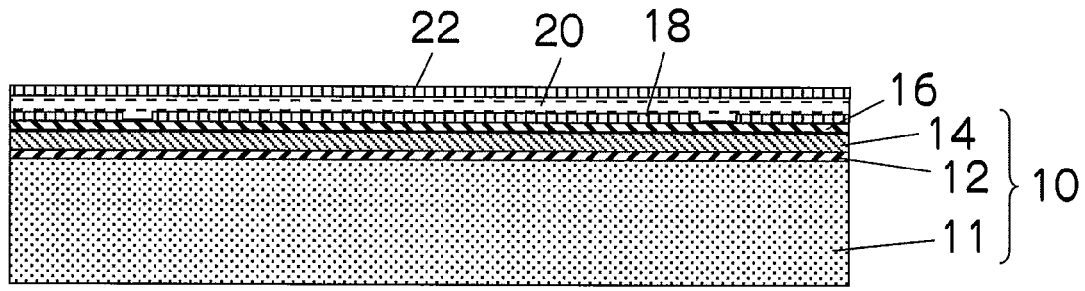
FIG. 5 is a diagram describing a step of forming an upper electrode.

When the piezoelectric film 20 has been deposited, a metal film 22 which is to form an upper electrode is deposited on the upper surface of the piezoelectric film 20 (the surface of the piezoelectric film 20 on the side opposite to the lower electrode 18), by sputtering, sol gelation, or the like. It is suitable to use iridium (Ir), platinum (Pt), titanium (Ti), gold (Au) or the like for the metal film (upper electrode) 22. FIG. 5 illustrates a state where the piezoelectric film 22 which forms the upper electrode has been deposited.

Figure 6:
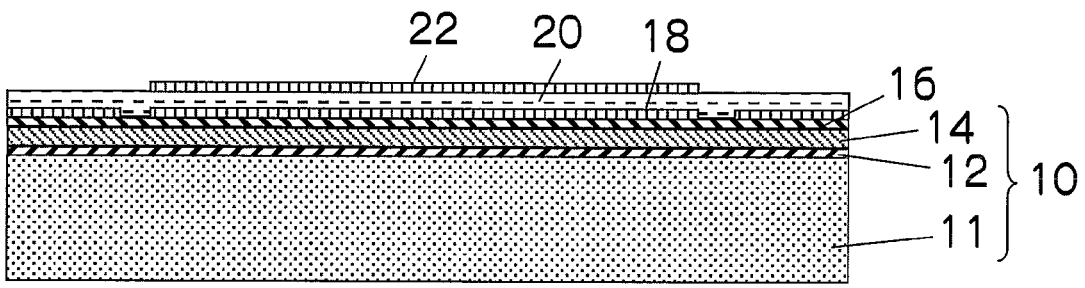
FIG. 6 is a diagram describing a step of patterning an upper electrode.

Thereupon, as illustrated in FIG. 6, the metal film 22 is patterned to a prescribed shape. It is suitable to use etching for patterning the upper electrode (metal film) 22 and patterning the lower electrode 18, and the patterning (etching) of the upper electrode 22 (and lower electrode 18) is carried out at a temperature of approximately 150° C.

Figure 7:
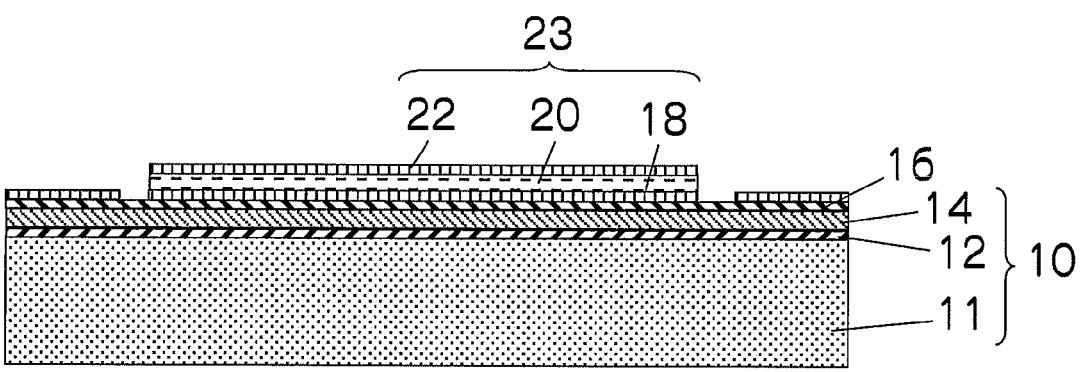
FIG. 7 is a diagram describing a step of patterning a piezoelectric film.

Thereupon, as illustrated in FIG. 7, the piezoelectric film 20 is patterned in accordance with the shape of the upper electrode 22. It is suitable to use etching to pattern the piezoelectric film 20, and the patterning of the piezoelectric film 20 is carried out at a temperature of approximately 150° C.

The patterning of the upper electrode 22 and the piezoelectric film 20 can be performed in the same process. Furthermore, it is also possible to adopt a mode in which the piezoelectric film 20 is deposited without patterning the lower electrode 18, the upper electrode 22 is also deposited, and the upper electrode 22, the piezoelectric film 20 and the lower electrode 18 are then all patterned together.

In the present specification, a structure in which a piezoelectric film 20 is sandwiched between the lower electrode 18 and the upper electrode 22 is called a "piezoelectric element", and a composition which drives the piezoelectric element and causes the piezoelectric element itself or other members to deform (vibrate) is called a piezoelectric actuator. To give one example of such a piezoelectric actuator, there is a structure in which a diaphragm bonded to a piezoelectric element is caused to deform.

(4) Step of Forming Wiring Layer

When a piezoelectric element 23 comprising a lower electrode 18, a piezoelectric film 20 and an upper electrode 22 has been formed by following the steps described above, a wiring layer having a wiring pattern which connects with the upper electrode 22 and the lower electrode 18 is formed on the upper surface of the substrate 10 (lower electrode forming surface). In the present embodiment, a plurality of piezoelectric elements 23 are provided, the lower electrode 18 is used as a common electrode which is common to the respective piezoelectric elements 23, the upper electrode 22 is used as an address electrode (individual electrode) which is individual to each piezoelectric element 23, and taking the lower electrode 18 as a reference potential, a drive voltage which is individual to each piezoelectric element 23 is applied to the upper electrode 22. The wiring layer forming step is carried out at an ambient temperature of 200° C. to 350° C.

(5) Step of Forming Pressure Chambers

Figure 8:
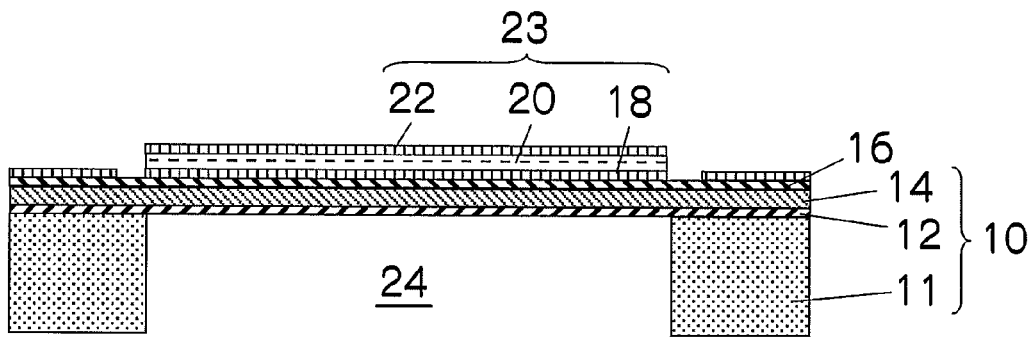
FIG. 8 is a diagram describing a step of forming a pressure chamber.
Figure 9:
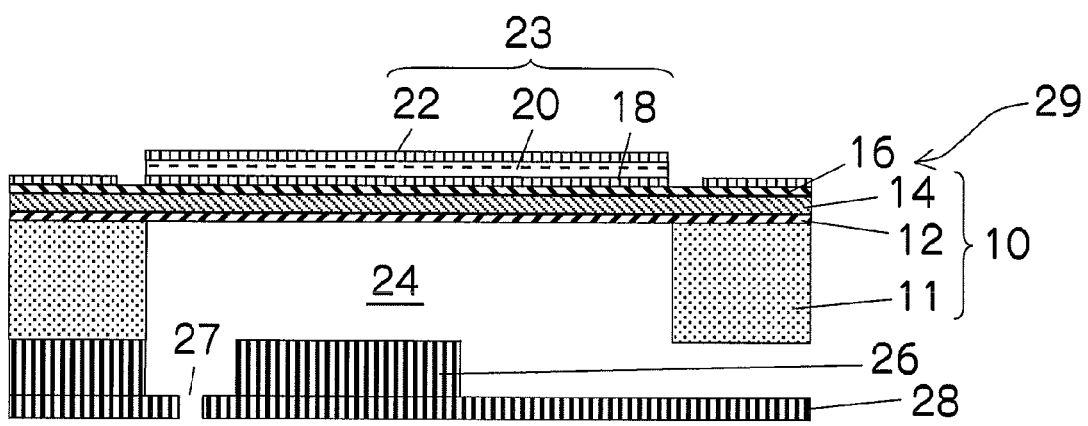
FIG. 9 is a diagram describing a step of bonding a flow channel substrate.

Next, an opening 24 which is to become a pressure chamber is formed in the silicon base material 11, using an etching method, or the like. FIG. 8 illustrates a state where an opening 24 which is to become a pressure chamber has been formed. The insulating layer 12, the silicon base material 14 and the insulating layer 16 function as a diaphragm. In other words, the structure in which a piezoelectric element 23 is formed on the diaphragm constituted by an insulating layer 12, a silicon base material 14 and an insulating layer 16 functions as a piezoelectric actuator.

(6) Flow Channel Plate Bonding Step; Nozzle Plate Bonding Step

As illustrated in FIG. 8, when the openings 24 which are to form the pressure chambers (pressure chambers 24) have been formed, a flow channel substrate 26 having a structure which is to form ink flow channels (grooves, holes, and the like) is bonded to the side of the substrate 10 where the pressure chambers 24 are formed. When bonding the substrate 10 to the flow channel substrate 26, the ink flow channels and the pressure chambers 24 are aligned accurately in position.

Moreover, a nozzle substrate 28 in which fine holes 27 which are to become nozzles are formed is bonded to the opposite side of the flow channel substrate 26 from the substrate 10, thereby creating a head structure 29. When bonding the substrate 28 to the nozzle substrate 26, the fine holes 27 and the ejection side flow channels are aligned accurately in position.

(7) Polarization Reversal Processing Step

When a head structure 29 has been formed by following the steps described above, the piezoelectric film 20 has an orientation direction (polarization direction) from the lower electrode 18 toward the upper electrode 22, and therefore polarization reversal is carried out in such a manner that the direction of polarization of the piezoelectric film 20 is in the direction from the upper electrode 22 toward the lower electrode 18.

More specifically, firstly, the piezoelectric film 20 is heated to the Curie temperature (in the present example, 350° C.) (heating step). Although the details are explained hereinafter, the heating temperature in the heating step should be a temperature equal to or greater than the temperature at which the coercive electric field of the piezoelectric film 20 becomes 0 V or lower (in the present example, 250° C.).

Figure 10:
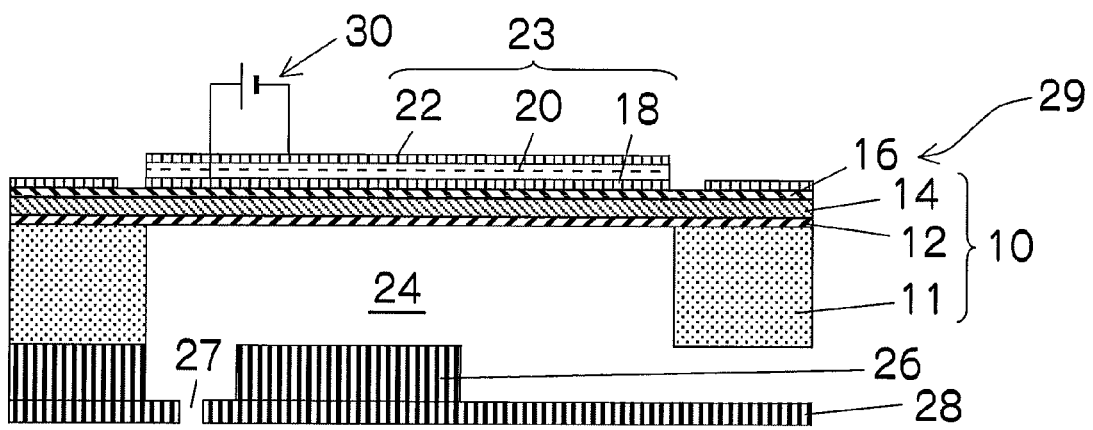
FIG. 10 is a diagram describing a step of reversing polarization.

The temperature of the piezoelectric film 20 is maintained at the Curie temperature, and an electric field is applied to the piezoelectric film 20 from the power supply apparatus 30 illustrated in FIG. 10 in the opposite direction to the direction of orientation, this electric field being sustained for one minute or longer (electric field application step). In the present embodiment, the intensity of the electric field in the electric field application step is 5 V or 7.5 V (see FIG. 12). If the magnitude of the electric field is raised too high, then the piezoelectric film 20 suffers an insulation breakdown, and therefore the electric field intensity must be equal to or lower than the maximum electric field intensity which avoids the occurrence of insulation breakdown in the piezoelectric film 20. Furthermore, taking account of surges, and the like, it is more desirable that the electric field intensity should be equal to or lower than ¼ of the maximum electric field intensity which avoids the occurrence of insulation breakdown.

Thereupon, while maintaining the application of electric field and gradually increasing the electric field intensity, the temperature of the piezoelectric film 20 is lowered and when the temperature of the piezoelectric film 20 has reached 100° C. or lower, the electric field applied to the piezoelectric film 20 is released (temperature lowering step).

The electric field intensity (applied voltage) in relation to temperature during the temperature lowering step is always set to be equal to or greater than the coercive electric field. The details of the relationship between the coercive electric field with respect to temperature and the applied voltage during polarization will be described below.

(8) Flexible Cable (FPC) Bonding Step

Figure 11:
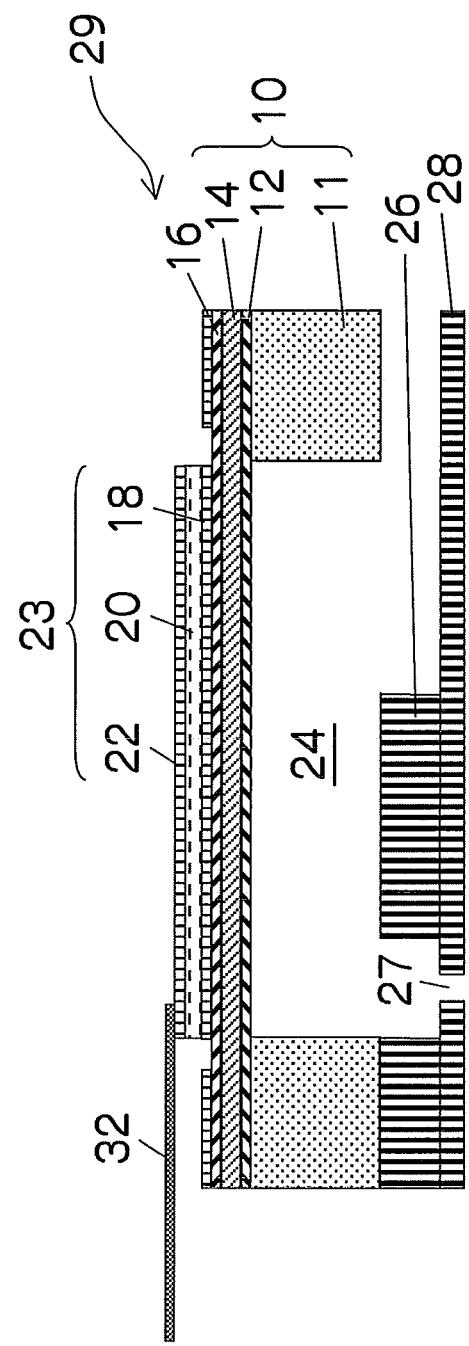
FIG. 11 is a diagram describing a step of bonding a FPC.

When a head structure 29 comprising a piezoelectric element 23 having a direction of polarization from the upper electrode 22 toward the lower electrode 18 has been formed by passing through the polarization reversal process illustrated in FIG. 10, a flexible cable (FPC) 32 formed with wires for the drive voltage to be applied to the piezoelectric elements 23 is connected electrically with the wiring layer formed in the wiring layer forming step (the above step (4)), the upper electrode 22 and the lower electrode 18. FIG. 11 illustrates a state where an FPC 32 has been connected to the head structure. FIG. 11 illustrates a schematic view of the state of connection between the FPC and the head structure 29, but in actual practice, bonding locations with the FPC 32 are provided in prescribed positions in the head structure 29. It is also possible to adopt a mode in which all or a portion of the drive circuits, such as the switch IC and drive IC, are mounted on the FPC 32. Furthermore, a desirable mode is one in which a connector is used to connect the head structure 29 with the FPC 32.

A conductive adhesive is suitable for use in connecting the FPC 32. The FPC connection step is carried out at an ambient temperature of approximately 100° C.

To give one example of the dimensions of the head structure 29 manufactured by the steps in (1) to (8) above, the thickness of the diaphragm (the structure comprising the insulating layer 12, the silicon base material 14, and the insulating layer 16) is 7 μm, the thickness of the piezoelectric element 23 is 4 μm, and the size of the opening of the pressure chamber 24 is 300 μm.

Description of Characteristics of Piezoelectric Element

Next, the characteristics of the piezoelectric elements 23 manufactured by the respective steps in (1) to (8) above will be described. Through experimentation carried out by the present applicants, it was discovered that the characteristics of the piezoelectric elements 23 change (the amount of displacement in the case of the same drive voltage changes) if the conditions of the polarization reversal step in (7) above are changed in the manufacture of the piezoelectric element 23.

Figure 12:
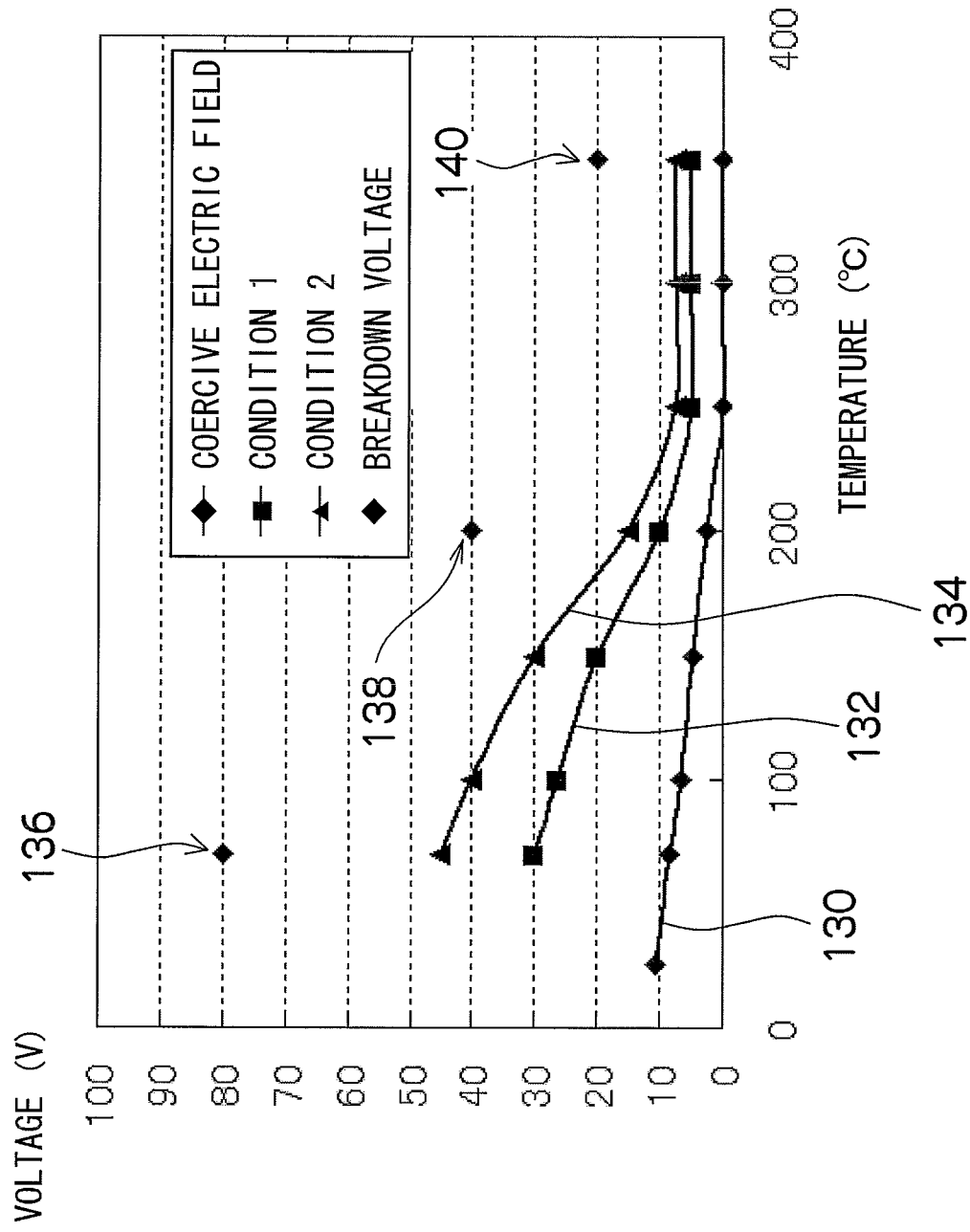
FIG. 12 is a diagram illustrating the temperature and electric field intensity conditions of the polarization reversal step in the method of manufacturing a liquid ejection head according to an embodiment of the present invention.

Reference numeral 130 in FIG. 12 indicates the relationship between the coercive electric field and the temperature of a piezoelectric element 23 (the piezoelectric film 20). The coercive electric field of the piezoelectric film 20 falls as the temperature rises, and at a temperature of 250° C. or above, the coercive electric field becomes 0 V and at the Curie temperature (350° C.), the coercive electric field becomes a negative value. In FIG. 12, a negative coercive electric field is indicated as 0 V.

Furthermore, the reference numeral 132 in FIG. 12 represents condition 1 in the polarization reversal step, reference numeral 134 represents condition 2 (in which a higher voltage is applied than in condition 1), and reference numerals 136, 138 and 140 respectively indicate the applied voltage at which the piezoelectric element 23 (piezoelectric film 20) produces insulation breakdown at 70° C., 200° C. and 350° C.

Experiment 1

"Table 2" below indicates the amount of displacement of the piezoelectric element in a case where voltage was applied according to condition 1 and condition 2 illustrated in FIG. 12 when the temperature was lowered, as well as the amount of displacement of the piezoelectric elements according to Comparative Examples 1 to 3. Under conditions 1 and 2, the temperature at the start of the polarization reversal process was 250° C., and the voltage applied initially was 5 V under condition 1 and 7.5 V under condition 2.

Furthermore, comparative example 1 is a case where the element was not polarized, comparative example 2 is a case where polarization reversal processing was carried out at normal temperature using an applied voltage of 7.5 V (corresponding to condition 2), and comparative example 3 is a case where polarization reversal processing was carried out at room temperature using an applied voltage of 5 V. The amount of displacement was measured by applying a sinusoidal voltage of 20 V and 1 kHz frequency at room temperature.

TABLE 2

|  | Condition 1 | Condition 2 | Comp. Ex. 1 (not polarized) | Comp. Ex. 2 | Comp. Ex. 3 |
| --- | --- | --- | --- | --- | --- |
| Amount of Displacement | 167 nm | 206 nm | 78 nm | 90 nm | 83 nm |

According to Table 2 shown above, it can be seen that the amount of displacement is increased in a piezoelectric element which has undergone polarization reversal processing (comparative examples 2 and 3), compared to a piezoelectric element which is not polarized (comparative example 1). Furthermore, since the amount of displacement is greater in comparative example 2 than in comparative example 3, then it can be seen that the amount of displacement increases if the applied voltage is larger.

However, it was discovered that, if the method of manufacturing a piezoelectric element according to the present embodiment is adopted, then under condition 1, the amount of displacement is approximately two times greater compared to a piezoelectric element which is not polarized, and under condition 2 which applies a higher voltage than condition 1, the amount of displacement is approximately three times greater compared to a piezoelectric element which is not polarized.

Consequently, a piezoelectric element 23 manufactured by the method stated in the present embodiment has favorable characteristics in comparison with a conventional commonly known piezoelectric element.

Experiment 2

Table 3 below indicates the difference in the amount of displacement of a piezoelectric element with difference in the release temperature (the temperature at which the electric field is released in the polarization reversal step). The condition 2 in FIG. 12 was used as the condition for the polarization reversal step. Furthermore, the measurement conditions of the amount of displacement were the same as those of experiment 1 described above.

TABLE 3

|  | Release temperature | | | | |
| --- | --- | --- | --- | --- | --- |
|  | 200° C. | 150° C. | 100° C. | 70° C. | 50° C. |
| Amount of Displacement | 95 nm | 143 nm | 193 nm | 206 nm | 206 nm |

As indicated in Table 3 shown above, the amount of displacement at a release temperature of 200° C. or 150° C. was 95 nm and 143 nm, respectively, and hence the amount of displacement was greatly reduced compared to a case there the release temperature was 70° C. or lower. In other words, if the electric field is released at a temperature of 150° C. or 200° C., then depolarization occurs and the performance of the piezoelectric film falls as a result of this depolarization, leading to significant decline in the amount of displacement.

On the other hand, the amount of displacement with a release temperature of 100° C. was 193 nm, and hence an amount of displacement substantially similar to when the release temperature is 70° C. or lower can be obtained. In other words, the decrease in the amount of displacement when the release temperature is set to 100° C. is very small.

Furthermore, if the release temperature was set to 50° C., then it was possible to obtain the same amount of displacement as when the release temperature was set to 70° C. In other words, the release temperature is desirably 100° C. or lower and more desirably 70° C. or lower.

Experiment 3

Table 4 below indicates the amount of displacement in accordance with difference in the heating temperature (start temperature) of the piezoelectric film in the heating step. Condition 1 and condition 2 in Table 4 below correspond to condition 1 and condition 2 in Experiment 1 (FIG. 12). Furthermore, the measurement conditions of the amount of displacement are the same as those of experiment 1 described above.

TABLE 4

| | Start temperature | | | | |
| --- | --- | --- | --- | --- | --- |
| | 350° C. | 300° C. | 250° C. | 200° C. | 100° C. |
| Condition 1 | 167 nm | 161 nm | 157 nm | 102 nm | 81 nm |
| Condition 2 | 206 nm | 200 nm | 198 nm | 121 nm | 100 nm |

As indicated in Table 4 shown above, if the application of the electric field started at a temperature of 250° C. or above, under condition 1 or condition 2, the amount of displacement did not decline, or only declined by a very small amount. On the other hand, if the application of the electric field started at a temperature of less than 250° C. (200° C. or 100° C.), then the amount of displacement declines greatly.

In other words, if an electric field for polarization reversal processing is applied in a state where the piezoelectric film has been heated to the temperature where the coercive electric field becomes 0 V or lower (in the present example, 250° C.), then a desirable piezoelectric film which is able to produce a large amount of displacement is manufactured. It is even more desirable if an electric field for polarization reversal processing is applied in a state where the piezoelectric film is heated to the Curie temperature (in the present example, 350° C.). Here, the coercive electric field is the coercive electric field on the negative side when the lower electrode 18 is set to ground potential and a positive voltage is applied to the upper electrode 22.

According to the method of manufacturing a liquid ejection head (piezoelectric element) having the composition as described above, a piezoelectric film which is polarized in the direction from the lower electrode toward the upper electrode is deposited by a method which forms a piezoelectric film having orientation, such as sputtering, the piezoelectric film is heated to a temperature at which the coercive electric field becomes 0 V or lower, an electric field for reversing polarization is applied (an electric field in the direction from the upper electrode toward the lower electrode), this state is maintained for a prescribed time period (for example, one minute), the electric field intensity is controlled in such a manner that application of an electric field equal to or greater than the coercive electric field is maintained while the temperature of the piezoelectric film is lowered, and the electric field is released when the temperature of the piezoelectric film becomes 100° C. or lower, and therefore the direction of polarization of the piezoelectric film having a direction of polarization from the lower electrode toward the upper electrode is reversed and a desirable piezoelectric film which enables control of the amount of displacement and the direction of displacement is manufactured.

The voltage applied in the polarization step is less than the voltage at which the insulation breaks down in the piezoelectric film at the temperature after heating, and it is particularly desirable that the voltage initially applied after heating should be equal to or less than ¼ of the voltage at which the piezoelectric film suffers insulation breakdown at the temperature after heating. Furthermore, a desirable mode is one in which the applied voltage is controlled in such a manner that the applied voltage increases gradually in accordance with the increase in the coercive electric field, during the fall in temperature.

Example of Apparatus

Next, an inkjet recording apparatus which comprises an inkjet head (liquid ejection head) employing piezoelectric elements manufactured by the method of manufacture explained above as the ejection generation elements will be described.

General Composition

Figure 13:
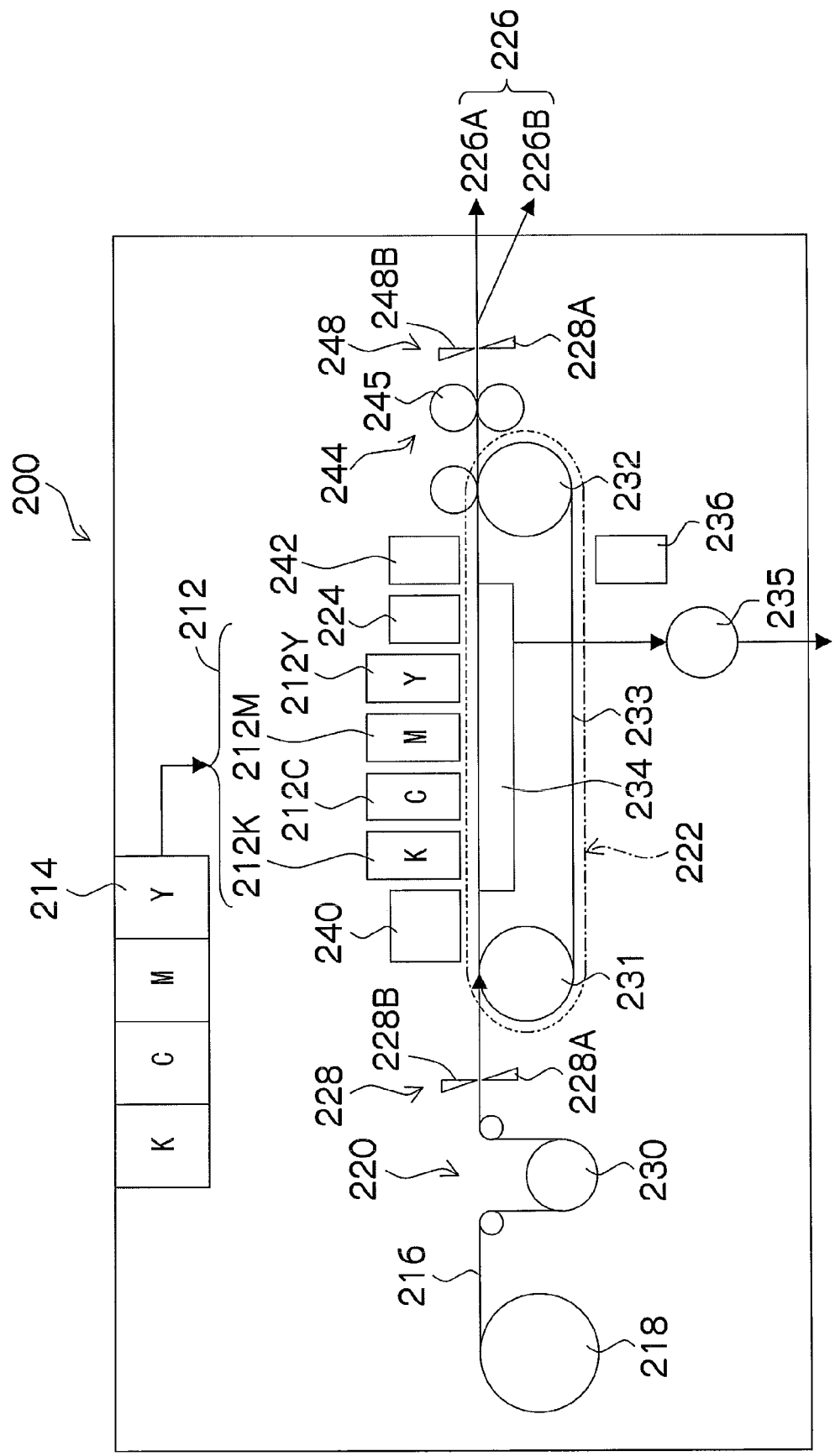
FIG. 13 is a general schematic drawing of an inkjet recording apparatus comprising a liquid ejection head (piezoelectric element) manufactured by applying an embodiment of the present invention.

FIG. 13 is a schematic drawing illustrating the general composition of an inkjet recording apparatus 200. As illustrated in FIG. 13, the inkjet recording apparatus 200 comprises: a print unit 212 having a plurality of inkjet heads (hereafter, called "heads") 212K, 212C, 212M, and 212Y provided for ink colors of black (K), cyan (C), magenta (M), and yellow (Y), respectively; an ink storing and loading unit 214 for storing inks to be supplied to the print heads 212K, 212C, 212M, and 212Y; a paper supply unit 218 for supplying recording paper 216 which is a recording medium (ejection receiving medium); a decurling unit 220 removing curl in the recording paper 216; a suction belt conveyance unit 222 disposed facing the nozzle face of the respective heads 212K, 212C, 212M, and 212Y for conveying the recording paper 216 while keeping the recording paper 216 flat; a print determination unit 224 for reading the printed result produced by the print unit 212; and a paper output unit 226 for outputting image-printed recording paper (printed matter) to the exterior.

Although not illustrated in FIG. 13, control substrates of the heads 212K, 212C, 212M and 212Y are disposed in a standing fashion on the upper faces (faces opposite to faces that face the recording paper 216) of the respective heads 212K, 212C, 212M and 212Y included in the print unit 212.

The ink storing and loading unit 214 has ink supply tanks (not illustrated in FIG. 13, but indicated by reference numeral 260 in FIG. 18) for storing the inks of different colors to be supplied to the heads 212K, 212C, 212M, and 212Y, and the inks of the respective colors are connected to the heads 212C, 212M, 212Y and 212K via prescribed ink flow channels.

The ink storing and loading unit 214 has a warning device (for example, a display device or an alarm sound generator) for warning when the remaining amount of any ink is low, and has a mechanism for preventing loading errors among the colors.

Although not described in detail here, the inkjet recording apparatus 200 according to the present embodiment comprises ink supply units which are provided on the upper faces of the respective heads 212K, 212C, 212M and 212Y, and ink is supplied to the heads 212K, 212C, 212M and 212Y via these ink supply units, from the ink storage and loading unit 214.

In FIG. 13, a magazine for rolled paper (continuous paper) is illustrated as an example of the paper supply unit 218; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which a plurality of types of recording paper can be used, it is desirable that an information recording medium such as a bar code and a wireless tag containing information about the type of paper is attached to the magazine, and by reading the information contained in the information recording medium with a predetermined reading device, the type of recording medium to be used (type of medium) is automatically determined, and ink-droplet ejection is controlled so that the ink-droplets are ejected in an appropriate manner in accordance with the type of medium.

The recording paper 216 delivered from the paper supply unit 218 retains curl due to having been loaded in the magazine. In order to remove the curl, heat is applied to the recording paper 216 in the decurling unit 220 by a heating drum 330 in the direction opposite from the curl direction in the magazine. The heating temperature at this time is desirably controlled so that the recording paper 216 has a curl in which the surface on which the print is to be made is slightly round outward.

In the case of the configuration in which roll paper is used, a cutter (first cutter) 228 is provided as illustrated in FIG. 13, and the continuous paper is cut into a desired size by the cutter 228. The cutter 228 has a stationary blade 228A, whose length is not less than the width of the conveyor pathway of the recording paper 216, and a round blade 228B, which moves along the stationary blade 228A. The stationary blade 228A is disposed on the reverse side of the printed surface of the recording paper 216, and the round blade 228B is disposed on the printed surface side across the conveyor pathway. When cut papers are used, the cutter 228 is not required.

After decurling, the cut recording paper 216 is delivered to the suction belt conveyance unit 222. The suction belt conveyance unit 222 has a structure in which an endless belt 233 is wound about rollers 231 and 232, in such a manner that at least the portion thereof which opposes the nozzle surfaces of the heads 212K, 212C, 212M and 212Y (the ink ejection surface in which the nozzle openings are formed) forms a horizontal surface (flat surface).

The belt 233 has a width that is greater than the width of the recording paper 216, and a plurality of suction apertures (not illustrated) are formed on the belt surface. A suction chamber 234 is disposed in a position facing the nozzle surface of the heads 212K, 212C, 212M, and 212Y on the interior side of the belt 233, which is set around the rollers 231 and 232, as illustrated in FIG. 13. The suction chamber 234 provides suction with a fan 235 to generate a negative pressure, and the recording paper 216 is held on the belt 233 by suction.

The belt 233 is driven in the clockwise direction in FIG. 13 by the motive force of a motor (not illustrated in FIG. 13, but indicated by reference numeral 288 in FIG. 19) being transmitted to at least one of the rollers 231 and 232, which the belt 233 is set around, and the recording paper 216 held on the belt 233 is conveyed from left to right in FIG. 13.

Since ink adheres to the belt 233 when a marginless print job or the like is performed, a belt-cleaning unit 236 is disposed in a predetermined position (a suitable position outside the printing area) on the exterior side of the belt 233. Although the details of the configuration of the belt-cleaning unit 236 are not illustrated, examples thereof include a configuration in which the belt 233 is nipped with cleaning rollers such as a brush roller or a water absorbent roller, an air blow configuration in which clean air is blown onto the belt 233, and a combination of these. In the case of the configuration in which the belt 233 is nipped with the cleaning rollers, it is desirable to make the line velocity of the cleaning rollers different from that of the belt 233 to improve the cleaning effect.

It is possible to employ a roller nip conveyance mechanism, in place of the suction belt conveyance unit 222. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is desirable.

A heating fan 240 is disposed on the upstream side of the print unit 212 in the conveyance pathway formed by the suction belt conveyance unit 222. The heating fan 240 blows heated air onto the recording paper 216 to heat the recording paper 216 immediately before printing so that the ink deposited on the recording paper 216 dries more easily.

Figure 14:
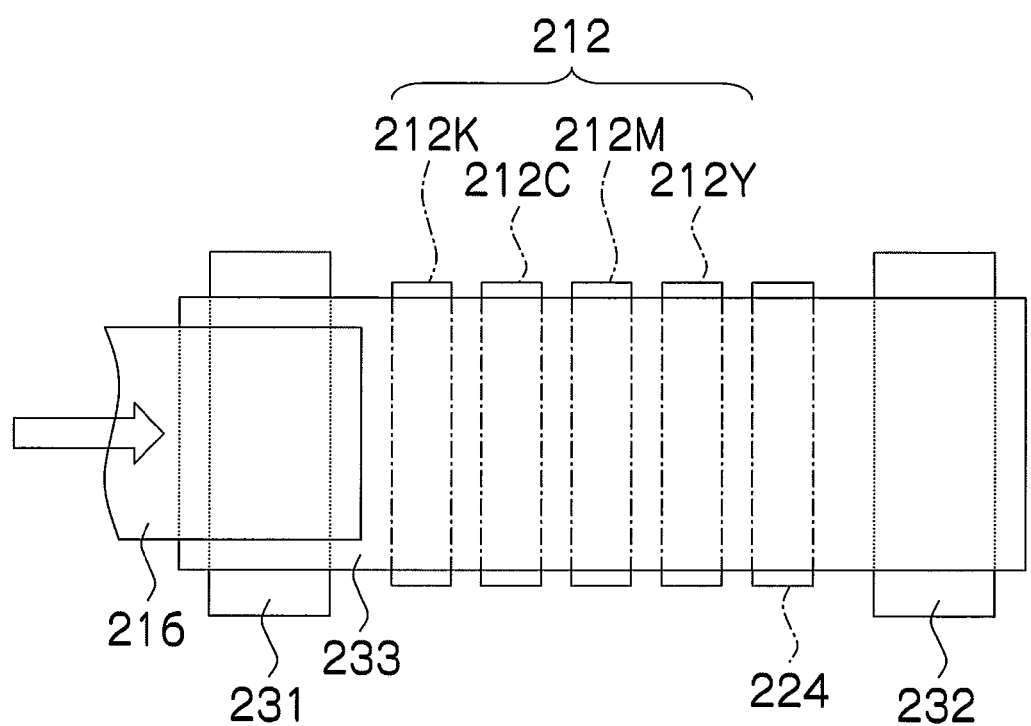
FIG. 14 is a principal plan diagram of the peripheral area of a print unit in the inkjet recording apparatus illustrated in FIG. 13.

The heads 212K, 212C, 212M and 212Y of the print unit 212 are full line heads having a length corresponding to the maximum width of the recording paper 216 used with the inkjet recording apparatus 200, and comprising a plurality of nozzles for ejecting ink arranged on a nozzle face through a length exceeding at least one edge of the maximum-size recording medium (namely, the full width of the printable range) (see FIG. 14).

The print heads 212K, 212C, 212M and 212Y are arranged in color order (black (K), cyan (C), magenta (M), yellow (Y)) from the upstream side in the feed direction of the recording paper 216, and these respective heads 212K, 212C, 212M and 212Y are fixedly installed in the conveyance direction (paper conveyance direction: medium conveyance direction) of the recording paper 216.

A color image can be formed on the recording paper 216 by ejecting inks of different colors from the heads 212K, 212C, 212M and 212Y, respectively, onto the recording paper 216 while the recording paper 216 is conveyed by the suction belt conveyance unit 222.

By adopting a configuration in which the full line heads 212K, 212C, 212M and 212Y having nozzle rows covering the full paper width are provided for the respective colors in this way, it is possible to record an image on the full surface of the recording paper 216 by performing just one operation of relatively moving the recording paper 216 and the print unit 212 in the paper conveyance direction, in other words, by means of a single sub-scanning action. By adopting a composition which is capable of single-pass printing in this way, higher-speed printing is thereby made possible and productivity can be improved in comparison with a shuttle type head configuration in which a recording head moves reciprocally in a direction which is perpendicular to the paper conveyance direction.

Although the configuration with the KCMY four standard colors is described in the present embodiment, combinations of the ink colors and the number of colors are not limited to those. Light inks, dark inks or special color inks can be added as required. For example, a configuration is possible in which inkjet heads for ejecting light-colored inks such as light cyan and light magenta are added. Furthermore, there are no particular restrictions of the sequence in which the heads of respective colors are arranged. In an inkjet recording apparatus based on a two-liquid system in which treatment liquid and ink are deposited on the recording paper 216, and the ink coloring material is caused to aggregate or become insoluble on the recording paper 216, thereby separating the ink solvent and the ink coloring material on the recording paper 216, it is possible to provide an inkjet head as a device for depositing the treatment liquid onto the recording paper 216.

Furthermore, each of the heads 212K, 212C, 212M and 212Y has a structure in which a plurality of head modules (not illustrated) are joined together in the breadthways direction of the recording paper 216, but each of the heads may also be formed as a single body.

The print determination unit 224 provided on the downstream side of the print unit 212 has an image sensor for capturing the ink droplet deposition result of the print unit 212, and functions as a device to check for ejection abnormalities, such as blocking of the nozzles from the droplet ejection image read in by the image sensor.

The print determination unit 224 of the present embodiment is configured with at least a line sensor having rows of photoelectric transducing elements with a width that is greater than the ink-droplet ejection width (image recording width) of the heads 212K, 212C, 212M, and 212Y This line sensor has a color separation line CCD sensor including an R light receiving element row composed of photoelectric transducing elements (pixels) arranged in a line provided with a red (R) filter, a G light receiving element row with a green (G) filter, and a B light receiving element row with a blue (B) filter. Instead of a line sensor, it is possible to use an area sensor composed of photoelectric transducing elements which are arranged two-dimensionally.

The print determination unit 224 reads in the test pattern printed by the recording heads 212K, 212C, 212M and 212Y of the respective colors, and determines the ejection performed by the respective heads 212K, 212C, 212M and 212Y The ejection determination includes the presence of the ejection, measurement of the dot size, and measurement of the dot landing position.

A post-drying unit 242 is disposed following the print determination unit 224. The post-drying unit 242 is a device to dry the printed image surface, and includes a heating fan, for example. It is desirable to avoid contact with the printed surface until the printed ink dries, and a device that blows heated air onto the printed surface is desirable.

A heating/pressurizing unit 244 is disposed following the post-drying unit 242. The heating/pressurizing unit 244 is a device to control the glossiness of the image surface, and the image surface is pressed with a pressure roller 245 having a predetermined uneven surface shape while the image surface is heated, and the uneven shape is transferred to the image surface.

When the recording paper 216 is pressed against the heating and pressurizing unit 244, then if, for instance, a dye-based ink has been printed onto a porous paper, this has the beneficial effect of increasing the weatherproofing of the image by closing the pores of the paper by pressurization, and thereby preventing the ink from coming into contact with elements which may cause the dye molecules to break down, such as ozone, or the like.

The printed matter generated in this manner is outputted from the paper output unit 226. The target print (i.e., the result of printing the target image) and the test print are desirably outputted separately. In the inkjet recording apparatus 200, a sorting device (not illustrated) is provided for switching the outputting pathways in order to sort the printed matter with the target print and the printed matter with the test print, and to send them to paper output units 226A and 226B, respectively. When the target print and the test print are simultaneously formed in parallel on the same large sheet of paper, the test print portion is cut and separated by a cutter (second cutter) 248. The cutter 248 is disposed directly in front of the paper output unit 226, and is used for cutting the test print portion from the target print portion when a test print has been performed in the blank portion of the target print. The structure of the cutter 248 is the same as the first cutter 228 described above, and has a stationary blade 248A and a round blade 248B.

Although not illustrated in FIG. 13, the paper output unit 226A for the target prints is provided with a sorter for collecting prints according to print orders.

Structure of the Head

Next, the structure of a head will be described. The heads 212K, 212C, 212M and 212Y of the respective ink colors have the same structure, and reference numeral 250 is hereinafter designated to any of the heads.

Figure 15C:
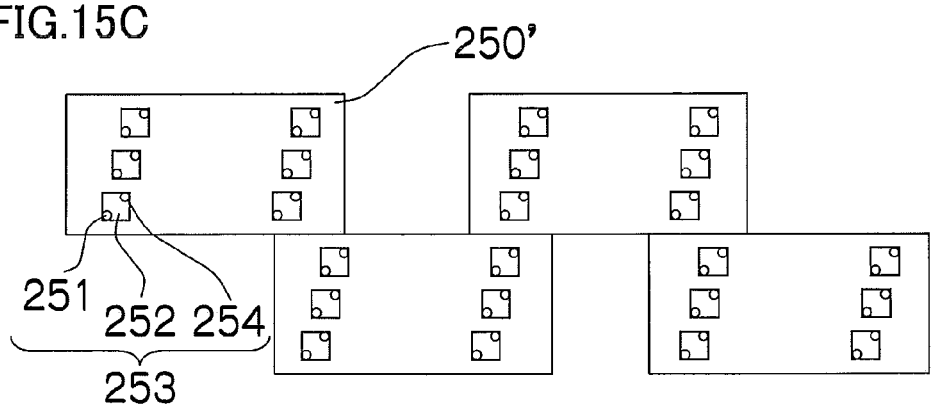

FIG. 15A is a perspective plan view illustrating an example of the configuration of the head 250, and FIG. 15B is an enlarged view of a portion thereof. Furthermore, FIG. 15C is a plan view perspective diagram illustrating a further example of the composition of a head 250, and FIG. 16 is a cross-sectional diagram along line XVI-XVI in FIGS. 15A and 15B.

The nozzle pitch in the head 250 should be minimized in order to maximize the density of the dots printed on the surface of the recording paper 216. As illustrated in FIGS. 15A and 15B, the head 250 according to the present embodiment has a structure in which a plurality of ink chamber units (droplet ejection elements) 253, each comprising a nozzle 251 forming an ink droplet ejection port, a pressure chamber 252 corresponding to the nozzle 251, and the like, are disposed two-dimensionally in the form of a staggered matrix, and hence the effective nozzle interval (the projected nozzle pitch) as projected in the lengthwise direction of the head 250 (the direction perpendicular to the paper conveyance direction) is reduced and high nozzle density is achieved.

The mode of forming one or more nozzle rows through a length corresponding to the entire width of the recording paper 216 in the main scanning direction substantially perpendicular to the conveyance direction of the recording paper 216 is not limited to the example described above. For example, instead of the configuration in FIG. 15A, as illustrated in FIG. 15C, a line head having nozzle rows of a length corresponding to the entire width of the recording paper 216 can be formed by arranging and combining, in a staggered matrix, short head units 250' having a plurality of nozzles 251 arrayed in a two-dimensional fashion. Furthermore, although not illustrated in the drawings, it is also possible to compose a line head by arranging short head units in one row.

The planar shape of a pressure chamber 252 provided for each nozzle 251 is substantially a square, and the nozzle 251 and a supply port 254 are disposed in both corners on a diagonal line of the square. Each pressure chamber 252 is connected to a common channel 255 through the supply port 254. The common channel 255 is connected to an ink supply tank (not illustrated in FIGS. 15A to 15C, but illustrated in FIG. 18 by the reference numeral 260), which is a base tank that supplies ink, and the ink supplied from the ink tank 60 is delivered through the common flow channel 255 in FIG. 16 to the pressure chambers 252.

A piezoelectric element 258 comprising a lower electrode (ground electrode, common electrode) 257A and an upper electrode (address electrode, individual electrode) 257B (the piezoelectric element corresponds to the piezoelectric element 23 in FIGS. 7 to 11) is bonded to the diaphragm 256 which constitutes the ceiling of the pressure chamber 252, and the piezoelectric element 258 is deformed by applying a drive voltage to the upper electrode 257B and the lower electrode 257A, thereby ejecting ink from the nozzle 251. When ink is ejected, new ink is supplied to the pressure chamber 252 from the common flow passage 255, via the supply port 254. Another possible mode is one in which one member serves as both the diaphragm 256 and the lower electrode 257A.

Furthermore, an insulating layer ($SiO_2$ layer) 259 is provided on the surface of the diaphragm 256 on the side of the pressure chambers 252, thereby ensuring insulating properties between the ink inside the pressure chambers 252 and the diaphragm 256, as well as preventing corrosion of the diaphragm 256 due to contact between the diaphragm 256 and the ink inside the pressure chambers 252.

Figure 17:
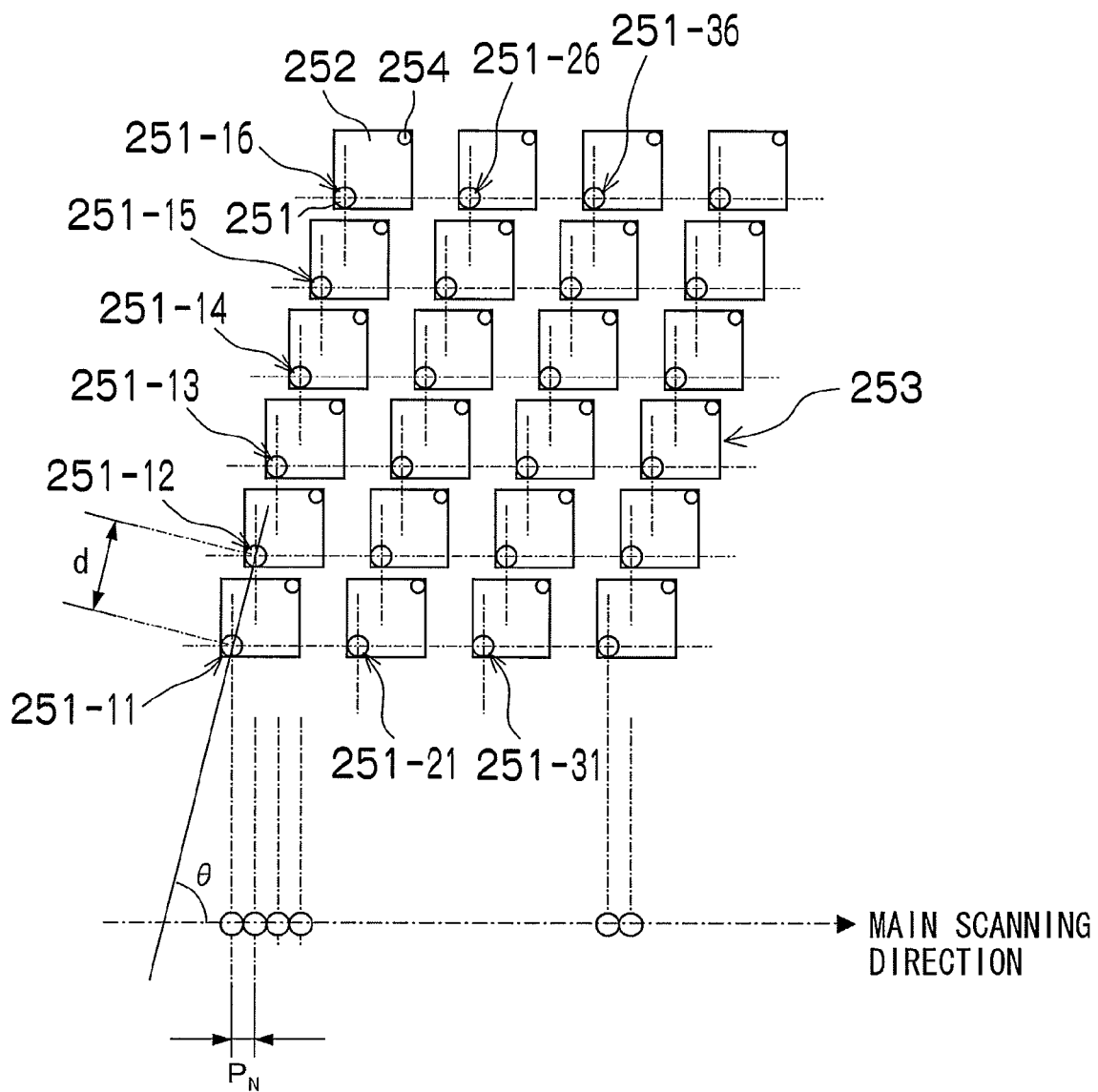
FIG. 17 is an enlarged view illustrating a nozzle arrangement in the print head illustrated in FIGS. 15A to 15C.

As illustrated in FIG. 17, the high-density nozzle head according to the present embodiment is achieved by arranging a plurality of ink chamber units 253 having the above-described structure in a lattice fashion based on a fixed arrangement pattern, in a row direction which coincides with the main scanning direction, and a column direction which is inclined at a fixed angle of θ with respect to the main scanning direction, rather than being perpendicular to the main scanning direction.

More specifically, by adopting a structure in which a plurality of ink chamber units 253 are arranged at a uniform pitch d in line with a direction forming an angle of θ with respect to the main scanning direction, the pitch P of the nozzles projected so as to align in the main scanning direction is d×cos θ, and hence the nozzles 251 can be regarded to be equivalent to those arranged linearly at a fixed pitch P along the main scanning direction. Such configuration results in a nozzle structure in which the nozzle row projected in the main scanning direction has a high nozzle density of up to 2,400 nozzles per inch.

In a full-line head comprising rows of nozzles that have a length corresponding to the entire width of the image recordable width, the "main scanning" is defined as printing one line (a line formed of a row of dots, or a line formed of a plurality of rows of dots) in the width direction of the recording paper 216 (the direction perpendicular to the conveyance direction of the recording paper 216) by driving the nozzles in one of the following ways: (1) simultaneously driving all the nozzles; (2) sequentially driving the nozzles from one side toward the other; and (3) dividing the nozzles into blocks and sequentially driving the nozzles from one side toward the other in each of the blocks.

In particular, when the nozzles 251 arranged in a matrix such as that illustrated in FIGS. 15A and 15B and FIG. 17 are driven, the main scanning according to the above-described (3) is preferred. More specifically, the nozzles 251-11, 251-12, 251-13, 251-14, 251-15 and 251-16 are treated as a block (additionally; the nozzles 251-21, 251-22, . . . , 251-26 are treated as another block; the nozzles 251-31, 251-32, . . . , 251-36 are treated as another block; . . . ); and one line is printed in the width direction of the recording paper 216 by sequentially driving the nozzles 251-11, 251-12, . . . , 251-16 in accordance with the conveyance velocity of the recording paper 216.

On the other hand, "sub-scanning" is defined as to repeatedly perform printing of one line (a line formed of a row of dots, or a line formed of a plurality of rows of dots) formed by the main scanning, while moving the full-line head and the recording paper 216 relatively to each other.

The direction indicated by one line (or the lengthwise direction of a band-shaped region) recorded by main scanning as described above is called the "main scanning direction", and the direction in which sub-scanning is performed, is called the "sub-scanning direction". In other words, in the present embodiment, the conveyance direction of the recording paper 216 is the sub-scanning direction and the width direction of the recording paper perpendicular to the sub-scanning direction is the main scanning direction. When implementing the present invention, the arrangement of the nozzles is not limited to that of the example illustrated.

When implementing the present invention, the arrangement structure of the nozzles is not limited to the example illustrated in the drawings, and it is also possible to apply various other types of nozzle arrangements, such as an arrangement structure having one nozzle row in the sub-scanning direction.

Configuration of an Ink Supply System

Figure 18:
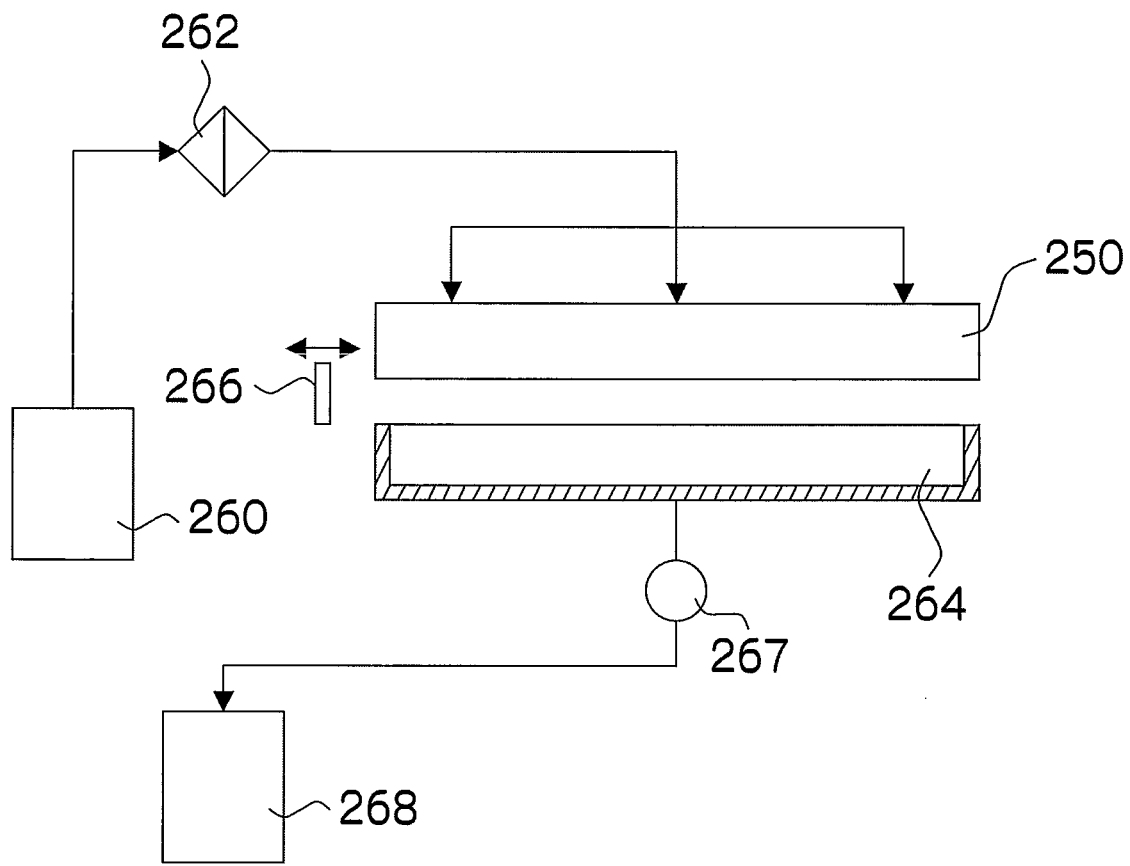
FIG. 18 is a schematic drawing illustrating the composition of an ink supply system in the inkjet recording apparatus illustrated in FIG. 13.

FIG. 18 is a schematic drawing illustrating the configuration of the ink supply system in the inkjet recording apparatus 200. The ink supplied tank 260 is a base tank that supplies ink to the head 250 and is set in the ink storing and loading unit 214 described with reference to FIG. 13. The aspects of the ink supplied tank 260 include a refillable type and a cartridge type: when the remaining amount of ink is low, the ink supplied tank 260 of the refillable type is filled with ink through a filling port (not illustrated) and the ink supplied tank 260 of the cartridge type is replaced with a new one. In order to change the ink type in accordance with the intended application, the cartridge type is suitable, and it is desirable to represent the ink type information with a bar code or the like on the cartridge, and to perform ejection control in accordance with the ink type.

A filter 262 for removing foreign matters and bubbles is disposed between the ink supplied tank 260 and the head 250 as illustrated in FIG. 18. The filter mesh size in the filter 262 is desirably equivalent to or less than the diameter of the nozzle and commonly about 20 μm.

Although not illustrated in FIG. 18, it is desirable to provide a sub-tank integrally to the print head 250 or nearby the head 250. The sub-tank has a damper function for preventing variation in the internal pressure of the head and a function for improving refilling of the print head.

The inkjet recording apparatus 200 is also provided with a cap 264 as a device to prevent the nozzles 251 from drying out or to prevent an increase in the ink viscosity in the vicinity of the nozzles 251, and a cleaning blade 266 as a device to clean the nozzle face 50A. The cap 264 can be relatively moved with respect to the head 250 by a movement mechanism (not illustrated), and is moved from a predetermined holding position to a maintenance position below the head 250 as required.

The cap 264 is displaced up and down relatively with respect to the head 250 by an elevator mechanism (not illustrated). When the power of the inkjet recording apparatus 200 is turned OFF or when in a print standby state, the cap 264 is raised to a predetermined elevated position so as to come into close contact with the head 250, and the nozzle face is thereby covered with the cap 264.

If the use frequency of a particular nozzle 251 is reduced and a nozzle continues in a state of not ejecting ink during a certain period of time or longer, during printing or during standby, then the ink solvent in the vicinity of the nozzle evaporates and the ink viscosity rises. When this state is reached, it becomes impossible to eject ink from the nozzle 251, even if the corresponding piezoelectric element 258 is operated.

The piezoelectric element 258 is operated before the nozzles assume this state (while the viscosity is still within a range which enables ejection by operation of the piezoelectric element 258), and a preliminary ejection (purge, blank ejection, spit ejection, dummy ejection) is performed toward a cap 264 (ink receptacle) in order to expel the degraded ink (ink in the vicinity of the nozzle which has increased in viscosity).

Moreover, when air bubbles enter into the ink inside the head 250 (inside the pressure chambers 252), it becomes impossible to eject ink from the nozzle, even if the piezoelectric element 258 is operated. In a case of this kind, the cap 264 is abutted against the head 250, the ink inside the pressure chamber 252 (the ink containing air bubbles) is removed by suctioning by a suctioning pump 267, and the ink removed by suctioning is supplied to the recovery tank 268.

This suction action entails the suctioning of degraded ink whose viscosity has increased (hardened) also when initially loaded into the head, or when service has started after a long period of being stopped. Since the suctioning operation is carried out with respect to all of the ink inside the pressure chambers 252, then the amount of ink consumption becomes large. Consequently, a desirable mode is one in which preliminary ejection is carried out while the increase in the viscosity of the ink is small.

Description of Control System

Figure 19:
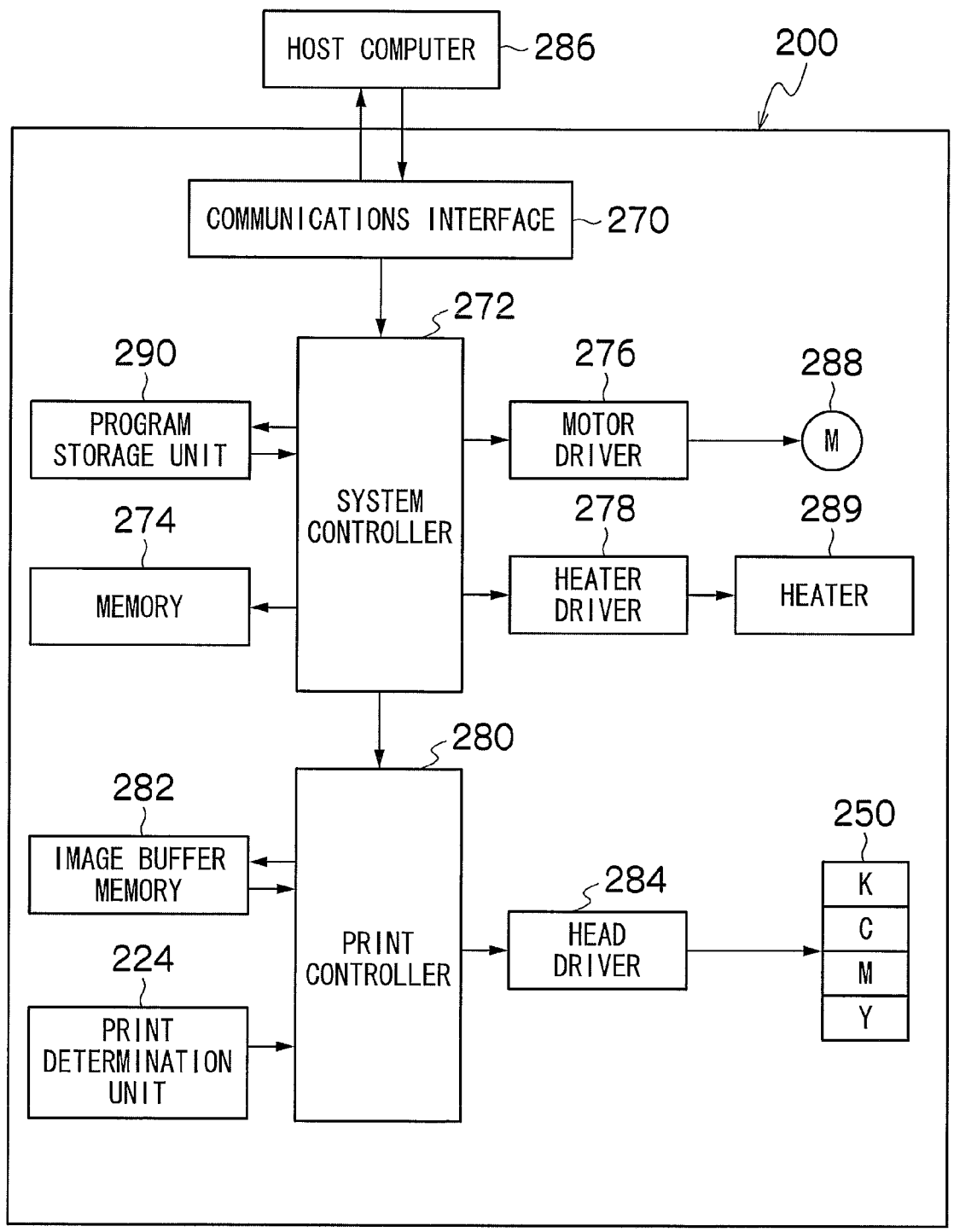
FIG. 19 is a principal block diagram illustrating a system configuration of the inkjet recording apparatus illustrated in FIG. 13.
Figure 20:
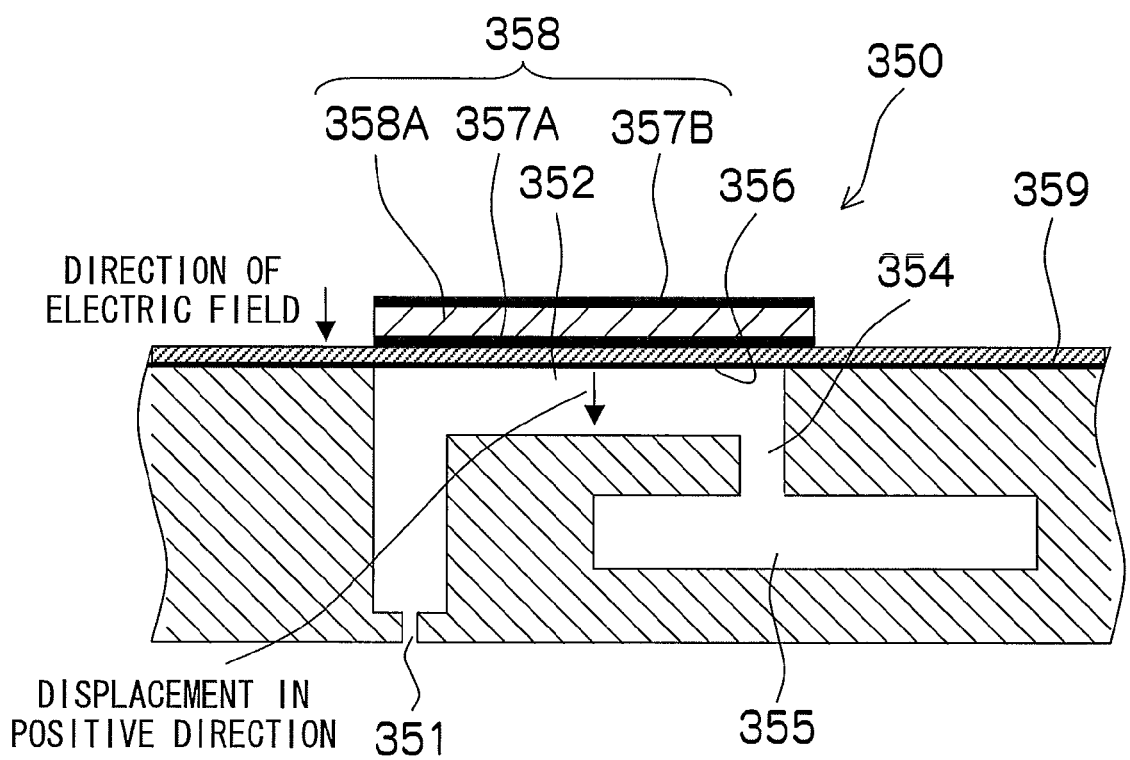
FIG. 20 is a diagram for describing problems associated with the related art.
Figure 21:
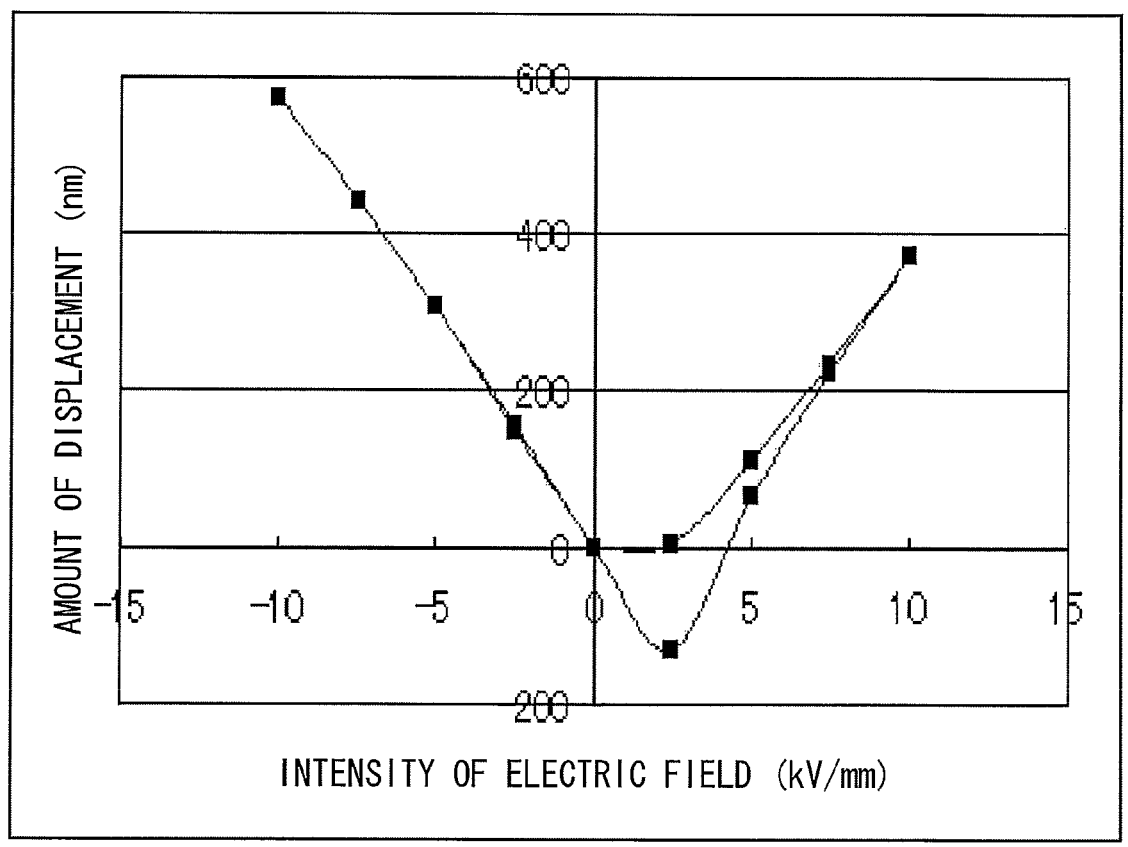
FIG. 21 is a graph illustrating the relationship between the amount of displacement and the electric field intensity in a piezoelectric element relating to the related art.
Figure 22:
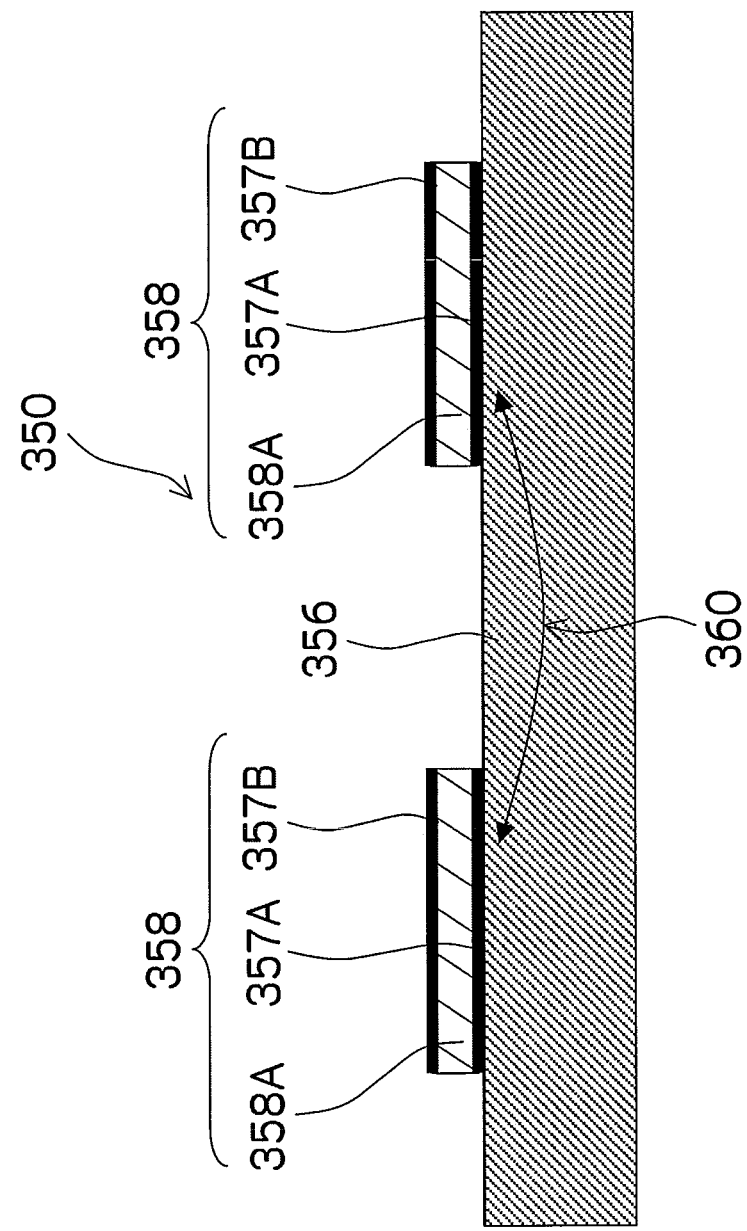
FIG. 22 is a diagram describing leakage current in a piezoelectric element relating to the related art.

FIG. 19 is a principal block diagram illustrating a system configuration of the inkjet recording apparatus 200. The inkjet recording apparatus 200 comprises a communications interface 270, a system controller 272, a memory 274, a motor driver 276, a heater driver 278, a print controller 280, an image buffer memory 282, a head driver 284, and the like.

The communications interface 270 is an interface unit for receiving image data sent from a host computer 286. A serial interface such as USB (Universal Serial Bus), IEEE1394, Ethernet (registered trademark), wireless network, or a parallel interface such as a Centronics interface may be used as the communications interface 270. A buffer memory (not illustrated) may be mounted in this portion in order to increase the communication speed. The image data sent from the host computer 286 is received by the inkjet recording apparatus 200 through the communications interface 270, and is temporarily stored in the memory 274.

The memory 274 is a storage device for temporarily storing images inputted through the communications interface 270, and data is written and read to and from the memory 274 through the system controller 272. The memory 274 is not limited to a memory composed of semiconductor elements, and a hard disk drive or another magnetic medium may be used.

The system controller 272 is constituted by a central processing unit (CPU) and peripheral circuits thereof, and the like, and it functions as a control device for controlling the whole of the inkjet recording apparatus 200 in accordance with prescribed programs, as well as a calculation device for performing various calculations. More specifically, the system controller 272 controls the various sections, such as the communications interface 270, memory 274, motor driver 276, heater driver 278, and the like, as well as controlling communications with the host computer 286 and writing and reading to and from the memory 274, and it also generates control signals for controlling the motor 288 of the conveyance system and the heater 289.

The programs executed by the CPU of the system controller 272 and the various types of data which are required for control procedures are stored in the memory 274. The memory 274 may be a non-writable storage device, or it may be a rewritable storage device, such as an EEPROM. The memory 274 is used as a temporary storage region for the image data, and it is also used as a program development region and a calculation work region for the CPU.

The motor driver 276 drives the motor 288 in accordance with commands from the system controller 272. In FIG. 19, the motors (actuators) disposed in the respective sections of the apparatus are represented by the reference numeral 288. For example, the motor 288 illustrated in FIG. 19 includes a motor which drives drive rollers 231 (232) of the belt 233 in FIG. 13, and a motor of a movement mechanism which moves the cap 264 in FIG. 18, and the like.

The heater driver 278 is a driver which drives heaters 289, including a heater forming a heat source of the heating fan 240 illustrated in FIG. 13, a heater of the post drying unit 242, and the like, in accordance with instructions from the system controller 272.

The print controller 280 has a signal processing function for performing various tasks, compensations, and other types of processing for generating print control signals from the image data stored in the memory 274 in accordance with commands from the system controller 272 so as to supply the generated print data (dot data) to the head driver 284. Required signal processing is carried out in the print controller 280, and the ejection amount and the ejection timing of the ink droplets from the respective print heads 250 are controlled via the head driver 284, on the basis of the print data. By this means, desired dot size and dot positions can be achieved.

The print controller 280 is provided with the image buffer memory 282; and image data, parameters, and other data are temporarily stored in the image buffer memory 282 when image data is processed in the print controller 280. Also possible is an aspect in which the print controller 280 and the system controller 272 are integrated to form a single processor.

The head driver 284 generates drive signals to be applied to the piezoelectric elements 258 of the head 250, on the basis of image data supplied from the print controller 280, and also comprises drive circuits which drive the piezoelectric elements 258 by applying the drive signals to the piezoelectric elements 258. A feedback control system for maintaining constant drive conditions in the head 250 may be included in the head driver 284 illustrated in FIG. 19.

The print determination unit 224 is a block that includes the line sensor as described above with reference to FIG. 13, reads the image printed on the recording paper 216, determines the print conditions (presence of the ejection, variation in the dot formation, and the like) by performing prescribed signal processing, or the like, and provides the determination results of the print conditions to the print controller 280.

According to requirements, the print controller 280 controls each unit so as to make various corrections and perform maintenance with respect to the head 250 on the basis of information obtained from the print determination unit 224.

The image data to be printed is externally inputted through the communications interface 270, and is stored in the memory 274. At this stage, RGB image data is stored in the memory 274.

The image data stored in the memory 274 is sent to the print controller 280 via the system controller 272, and is converted by the print controller 280 into dot data for the respective ink colors. In other words, the print controller 280 performs processing for converting the input RGB image data into dot data for the four colors of K, C, M and Y The dot data generated by the print controller 280 is stored in the image buffer memory 282.

Various control programs are stored in the program storage unit 290, and a control program is read out and executed in accordance with commands from the system controller 272.

The program storage unit 290 may use a semiconductor memory, such as a ROM, EEPROM, or a magnetic disk, or the like. An external interface may be provided, and a memory card or PC card may also be used. Naturally, a plurality of these recording media may also be provided. The program storage unit 290 may also be combined with a storage device for storing operational parameters, and the like (not illustrated).

The apparatus composition illustrated in FIG. 13 to FIG. 19 is one example of an apparatus which comprises a liquid ejection head (piezoelectric elements) manufactured by using the method of manufacturing a liquid ejection head (piezoelectric elements) according to an embodiment of the present invention, and this composition can be modified suitably. For example, FIG. 13 illustrates a mode in which the recording paper 216 is conveyed by a belt, but it is also possible to adopt a mode in which an image is recorded by a print unit 212 which is arranged about the circumferential surface of a drum, while conveying the recording paper 216 by using a drum-shaped conveyance member.

In the present embodiment, an inkjet recording apparatus comprising an inkjet head is described as an example of an apparatus to which an embodiment of the present invention is applied, but the present invention can also be applied broadly to a liquid ejection head and apparatus which uses piezoelectric elements as ejection generating elements. Another example of such an apparatus is a liquid ejection apparatus (for example, a dispenser) which forms a desired shape or pattern by ejecting liquid onto a substrate (medium).

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a piezoelectric element, comprising:
   a piezoelectric element forming step of forming a piezoelectric element including an upper electrode, a lower electrode and a piezoelectric film, the upper and lower electrodes being configured to be arranged on the piezoelectric film, the piezoelectric film being deposited in epitaxial growth or orientated growth;
   a heating step of heating the piezoelectric film to a temperature not lower than a temperature at which a coercive electric field of the piezoelectric film becomes not higher than 0 V;
   an electric field application step of applying to the piezoelectric film, an applied electric field in an opposite direction to a direction of orientation of the piezoelectric film while maintaining the temperature to which the piezoelectric film is heated in the heating step; and
   a temperature lowering step of lowering a temperature of the piezoelectric film to a temperature, in degrees Celsius, not higher than 1/3 of the Curie temperature while maintaining the applied electric field of a magnitude not lower than the coercive electric field applied to the piezoelectric film after the electric field application step, and then releasing the applied electric field applied to the piezoelectric film.

2. The method of manufacturing a piezoelectric element as defined in claim 1, wherein the temperature to which the piezoelectric film is heated in the heating step is not lower than 250° C.

3. The method of manufacturing a piezoelectric element as defined in claim 1, wherein, in the temperature lowering step, the magnitude of the applied electric field applied to the piezoelectric film is increased in accordance with the coercive electric field which increases as the temperature of the piezoelectric film falls.

4. The method of manufacturing a piezoelectric element as defined in claim 1, wherein, in the temperature lowering step, the applied electric field applied to the piezoelectric film is released when the temperature of the piezoelectric film becomes not higher than 100° C.

5. The method of manufacturing a piezoelectric element as defined in claim 1 wherein, in the temperature lowering step, the applied electric field applied to the piezoelectric film is released when the temperature of the piezoelectric film becomes not higher than 70° C.

6. The method of manufacturing a piezoelectric element as defined in claim 1, wherein in the piezoelectric element forming step, the piezoelectric film is formed by any one technique of a sputtering method, a chemical vapor deposition method and a sol-gel method.

\* \* \* \* \*